(12) United States Patent
Shin et al.

(10) Patent No.: US 8,148,828 B2
(45) Date of Patent: Apr. 3, 2012

(54) SEMICONDUCTOR PACKAGING DEVICE

(75) Inventors: Dong-Woo Shin, Cheonan-si (KR);
Seong-Chan Han, Cheonan-si (KR);
Sun-Kyu Hwang, Asan-si (KR);
Hyun-Jong Oh, Seoul (KR); Nam-Yong Oh, Cheonan-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 103 days.

(21) Appl. No.: 12/604,680

(22) Filed: Oct. 23, 2009

(65) Prior Publication Data

US 2010/0102427 A1 Apr. 29, 2010

(51) Int. Cl.
*H01L 23/48* (2006.01)
*H01L 23/34* (2006.01)

(52) U.S. Cl. ........ 257/787; 257/686; 257/778; 257/723; 257/E23.116

(58) Field of Classification Search .................. 257/686, 257/787, 778, 780, E23.116, 72
See application file for complete search history.

(56) References Cited

U.S. PATENT DOCUMENTS

| | | | | |
|---|---|---|---|---|
| 5,220,200 A * | 6/1993 | Blanton | ........................ | 257/778 |
| 5,448,114 A * | 9/1995 | Kondoh et al. | ................ | 257/778 |
| 5,720,100 A * | 2/1998 | Skipor et al. | ..................... | 29/840 |
| 6,122,171 A * | 9/2000 | Akram et al. | .................. | 361/704 |
| 7,547,978 B2 * | 6/2009 | Hembree et al. | ............... | 257/788 |
| 7,651,938 B2 * | 1/2010 | Too et al. | ........................ | 438/615 |
| 2002/0135063 A1 * | 9/2002 | Alcoe et al. | .................... | 257/734 |
| 2003/0090006 A1 * | 5/2003 | Farnworth | ..................... | 257/787 |
| 2008/0237895 A1 * | 10/2008 | Saeki | ............................ | 257/787 |

FOREIGN PATENT DOCUMENTS

| | | |
|---|---|---|
| JP | 2002-076202 | 3/2002 |
| JP | 2006-108588 | 4/2006 |
| JP | 2006-278817 | 10/2006 |
| KR | 2001-0017143 | 3/2001 |

* cited by examiner

*Primary Examiner* — Nitin Parekh

(74) *Attorney, Agent, or Firm* — Stanzione & Kim, LLP

(57) ABSTRACT

A semiconductor packaging device is provided. Semiconductor package groups, a side retainer wall, and a filling layer may be located on a base plate. The side retainer wall may be located around the semiconductor package groups. The filling layer may be located between the side retainer wall and the semiconductor package groups.

39 Claims, 26 Drawing Sheets

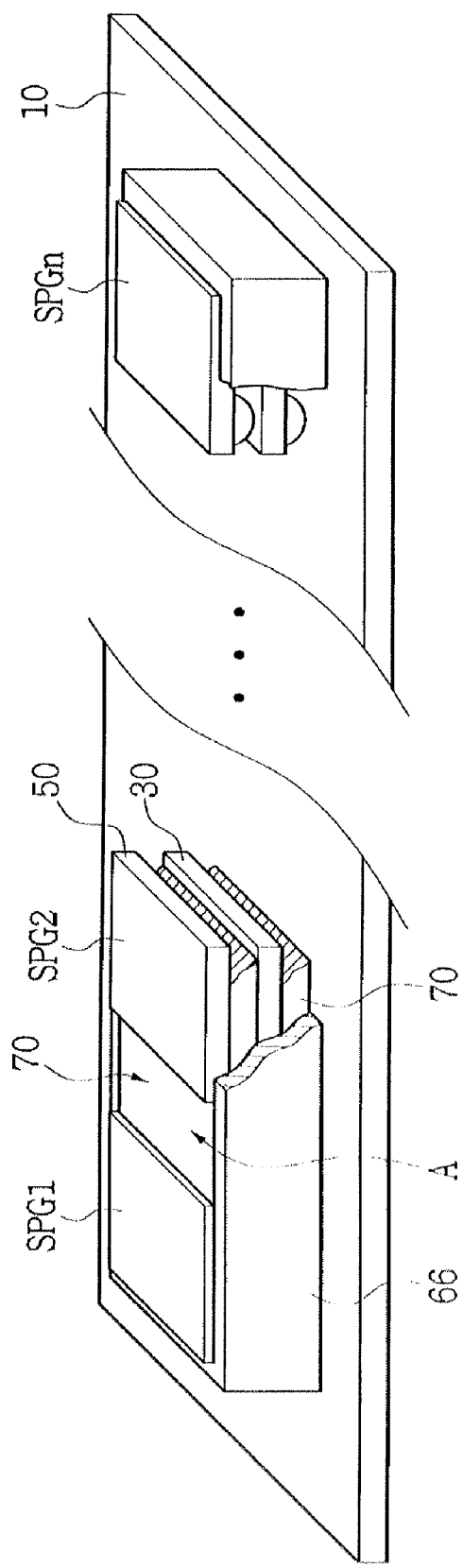

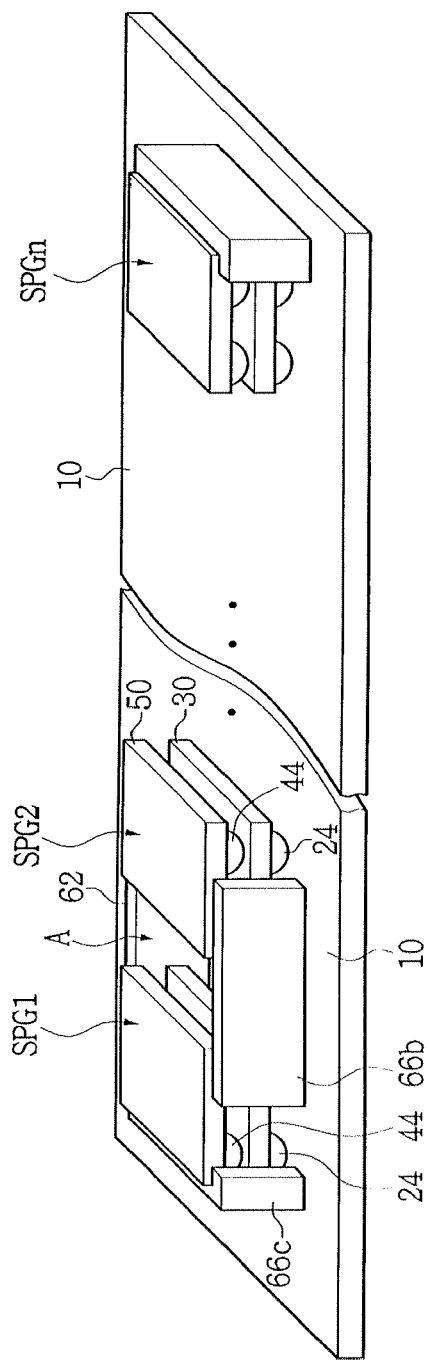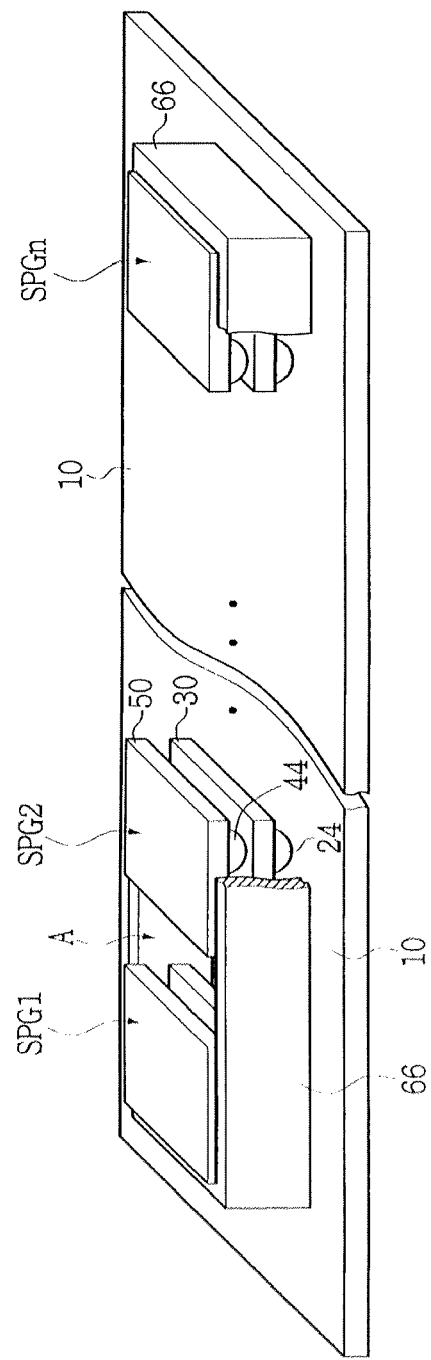

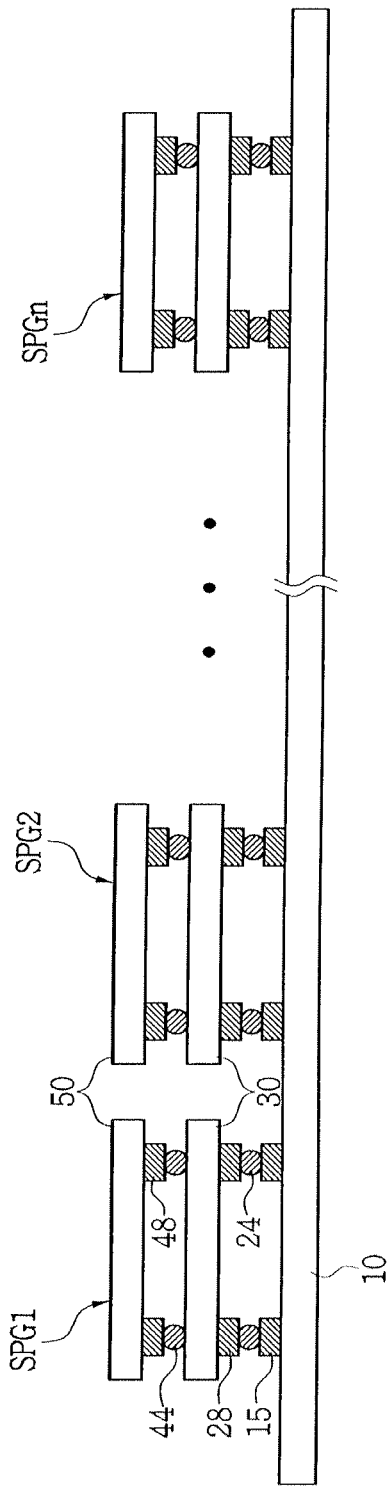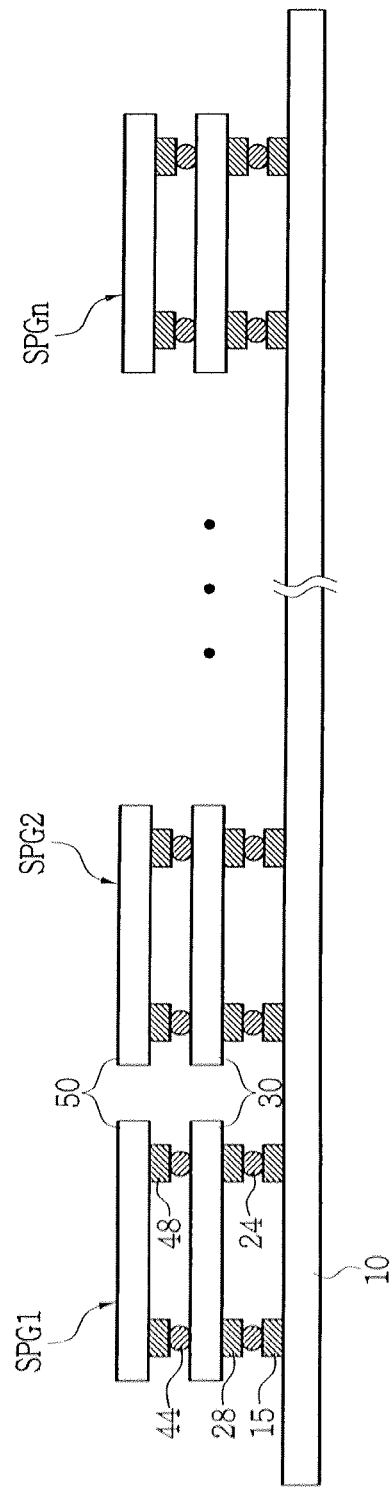

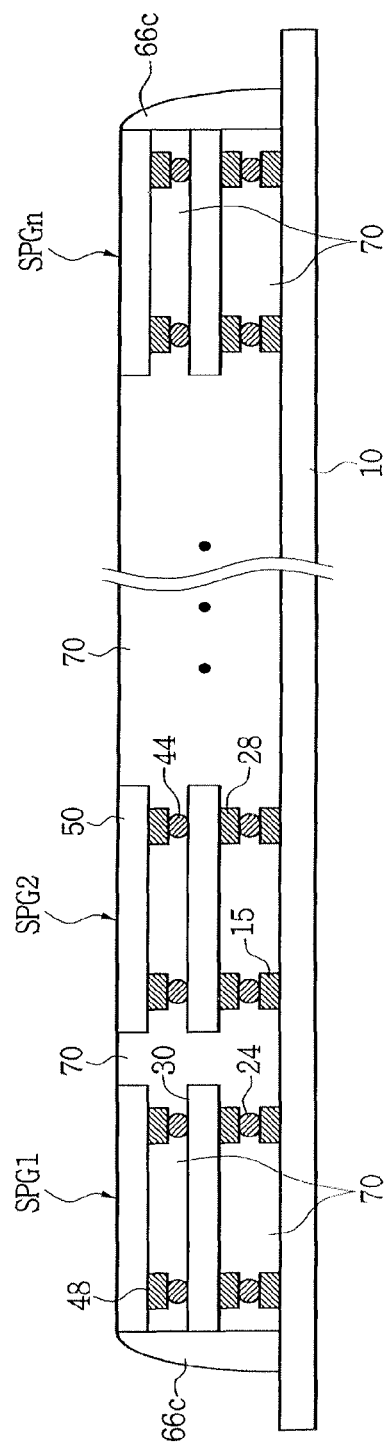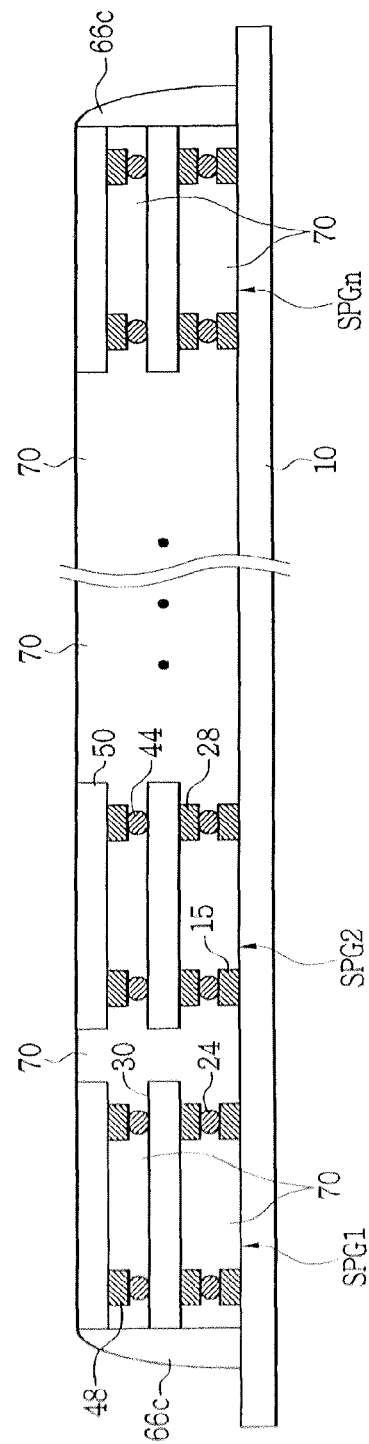

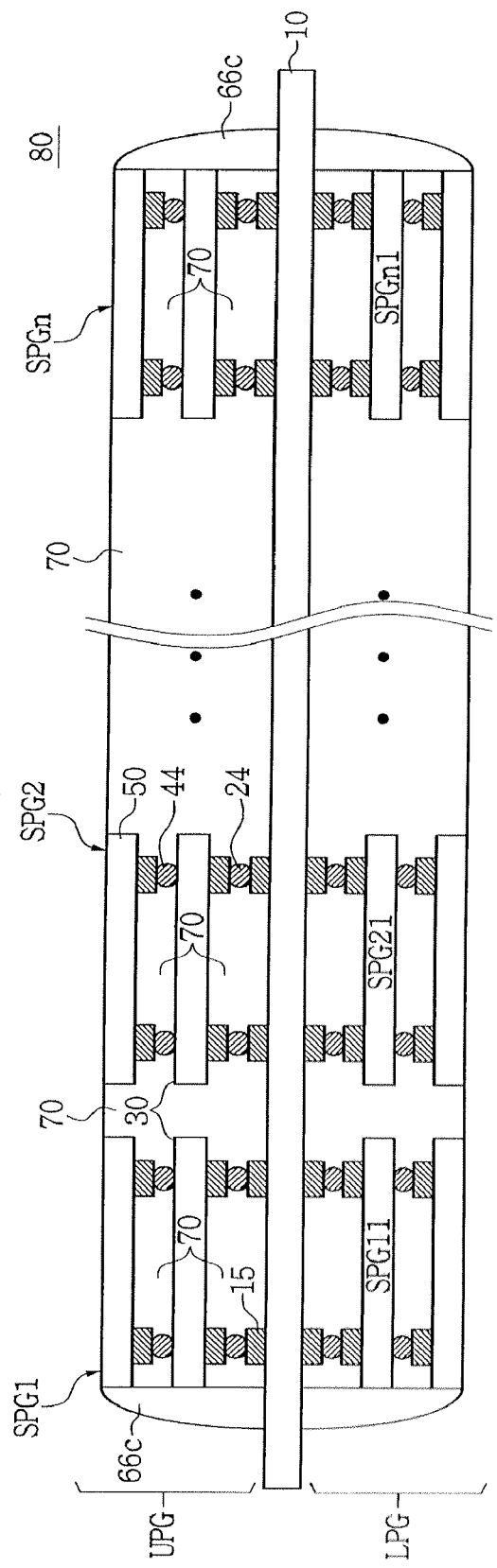

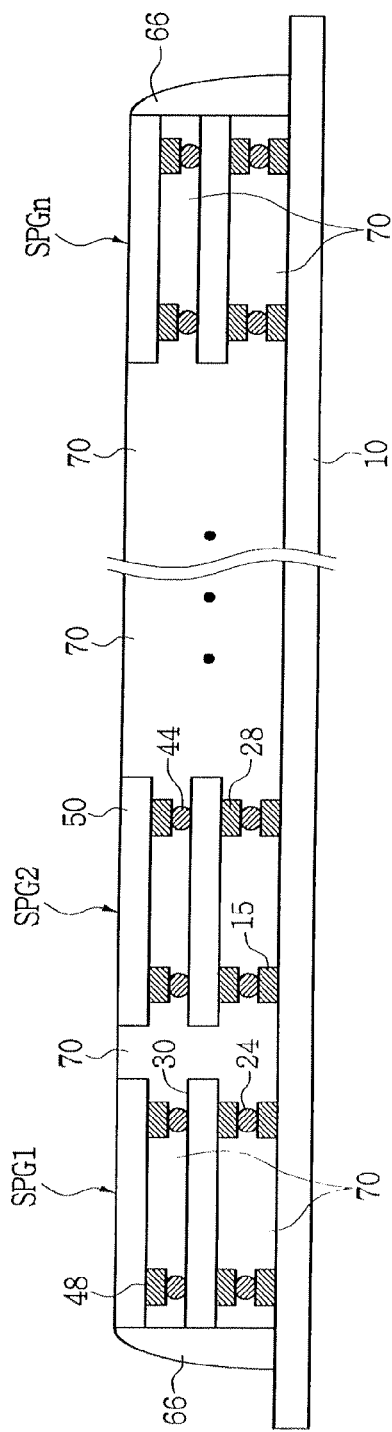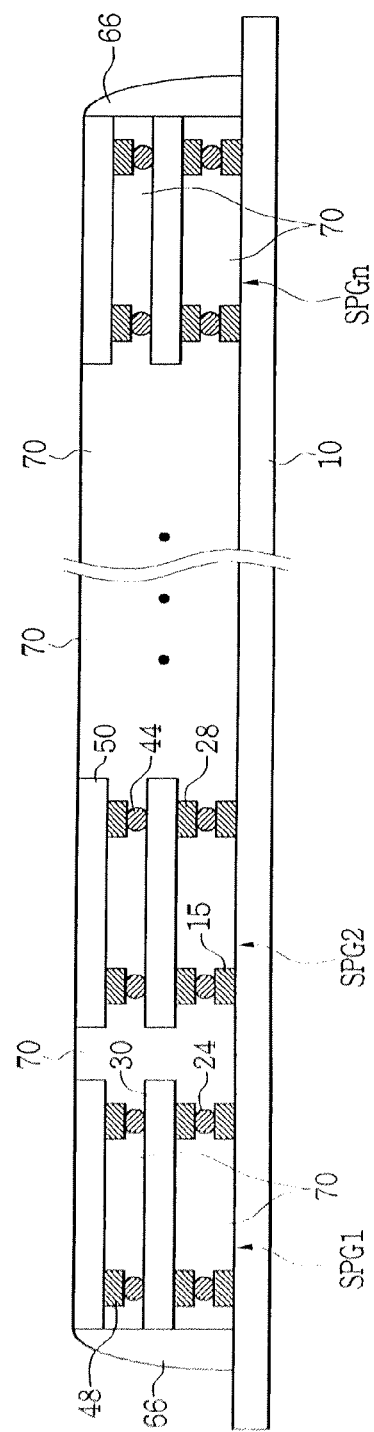

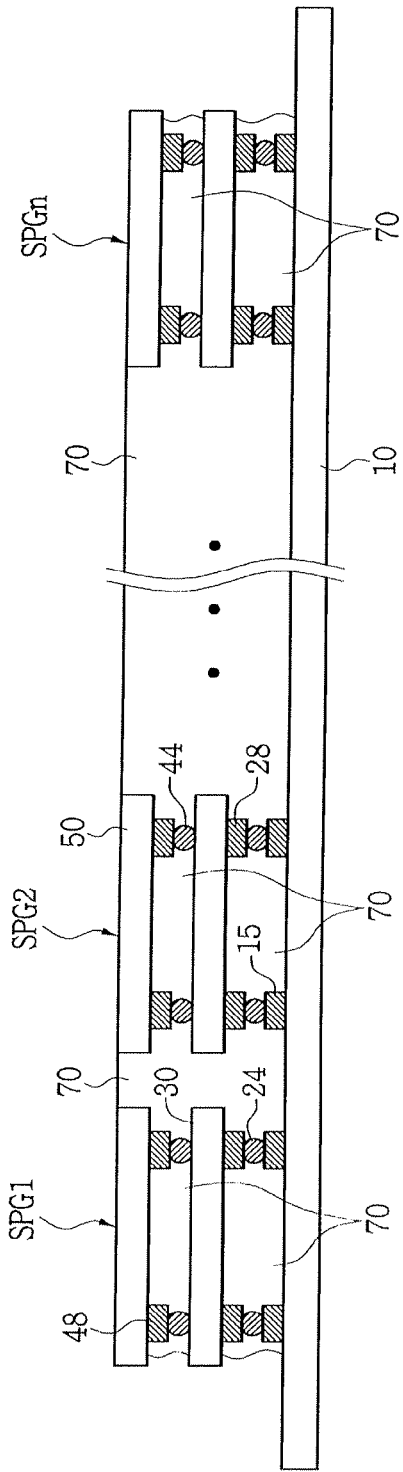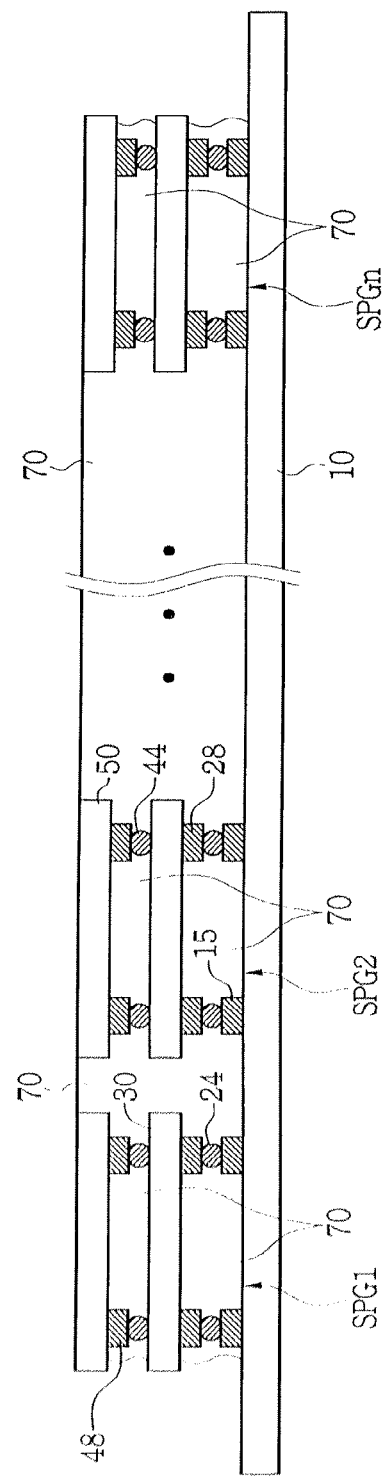

SEMICONDUCTOR PACKAGING DEVICE

CROSS-REFERENCE TO RELATED APPLICATIONS

This application claims the benefit of priority under 35 U.S.C. §119 from Korean Patent Application No. 10-2008-0104428, filed on Oct. 23, 2008, the contents of which are hereby incorporated herein by reference in their entirety.

BACKGROUND

1. Field of the Invention

Example embodiments relate to a semiconductor packaging device in which at least one side retainer wall is located around semiconductor package groups on a base plate.

2. Description of the Related Art

Recently, to accommodate the trend of having multi-function electronic devices, semiconductor packaging devices have been manufactured on a single base plate using semiconductor package groups. The base plate may have interconnections to connect the package groups to other groups or devices. The semiconductor package groups may be attached to the base plate using a filling layer. The filling layer may be injected through a dispenser nozzle in a semiconductor packaging assembly line. However, the filling layer has to be formed on the base plate to a sufficient thickness and for a sufficient period of time so that only the top surfaces of the semiconductor packaging groups are exposed. The filling layer may flow into a space between the semiconductor packaging groups and partially leak out through edges of the base plate.

SUMMARY

Example embodiments provide a semiconductor packaging device which is suitable to physically control the flow of the filling layer from the semiconductor package groups.

Additional aspects and utilities of the present general inventive concept will be set forth in part in the description which follows and, in part, will be obvious from the description, or may be learned by practice of the general inventive concept.

Example embodiments also provide a semiconductor packaging device having at least one side retainer wall which is located around semiconductor package groups on a base plate.

Features and/or utilities of the present general inventive concept may be realized by a semiconductor packaging device including a base plate, a plurality of first semiconductor package groups located on the base plate, a side retainer wall which extends upward from a main surface of the base plate and surrounds the first semiconductor package groups, and a filling layer which contacts the side retainer wall and is located between the first semiconductor package groups.

Each of the first semiconductor package groups may include semiconductor packages which are sequentially stacked, the side retainer wall may contact sides of the first semiconductor package groups, and the filling layer may be located between the semiconductor packages of each of the first semiconductor package groups.

The semiconductor packaging device may further include a plurality of second semiconductor package groups located on a surface opposite to the main surface of the base plate, and the second semiconductor package groups may either have the same structure as the first semiconductor package groups or a different structure from the first semiconductor package groups.

Other features and/or utilities of the present general inventive concept may be realized by a semiconductor packaging device including a base plate, a plurality of first semiconductor package groups located on the base plate, side retaining walls which extend upward from a main surface of the base plate and are located adjacent to the first semiconductor package groups, and a filling layer which contacts the side retainer walls and is located between the first semiconductor package groups.

Each of the first semiconductor package groups may include semiconductor packages which are sequentially stacked, the side retainer walls may be located between the first semiconductor package groups and at locations corresponding to the outermost semiconductor package groups among the first semiconductor package groups and may contact sides of the first semiconductor package groups, and the filling layer may be located between the semiconductor packages of each of the first semiconductor package groups.

The semiconductor packaging device may further include a plurality of second semiconductor package groups located on a surface opposite to the main surface of the base plate, and the second semiconductor package groups may have either the same structure as the first semiconductor package groups or a different structure than the first semiconductor package groups.

Additional features and/or utilities of the present general inventive concept may include a semiconductor packaging device including a base plate, a plurality of first semiconductor package groups located on the base plate, side retainer walls which extend upward from a main surface of the base plate and are located along a side of the first semiconductor package groups, and a filling layer which contacts the side retainer walls and is located between the first semiconductor package groups.

Each of the first semiconductor package groups may include semiconductor packages which are sequentially stacked, the side retainer walls may be located between the first semiconductor package groups and may contact sides of the first semiconductor package groups, and the filling layer may be located between the semiconductor packages of each of the first semiconductor package groups.

In example embodiments, the semiconductor packaging device may further include a plurality of second semiconductor package groups located on a surface opposite to the main surface of the base plate, and the second semiconductor package groups may have either the same structure as the first semiconductor package groups or a different structure than the first semiconductor package groups.

Other features and/or utilities of the present general inventive concept may be realized by a semiconductor packaging device including a substrate, a first plurality of stacked semiconductor devices on a first surface of the substrate, a first retainer wall adjacent to the first plurality of stacked semiconductor devices, and a first filling to fill spaces defined by the first retainer wall and the first plurality of stacked semiconductor devices.

The first retainer wall may be located along only a first side of the first plurality of semiconductor devices and a second side opposite the first side. Alternatively, the first retainer wall may entirely surround the first plurality of stacked semiconductor devices.

The first plurality of stacked semiconductor devices may be arranged in a row on the substrate, and the first retainer wall may include at least a first side portion on a first side of the first plurality of stacked semiconductor devices, at least a second side portion on a second side of the first plurality of stacked semiconductor devices, and at least one end portion at each end of the row of stacked semiconductor devices, and the first retainer wall may have at least one gap between two adjacent side portions, or between a side portion and an adjacent end portion.

The first retainer wall may contact a first side of each stacked semiconductor device on a first side of the row, a second side of each semiconductor device on a second side of the row opposite the first side, and a side of each stacked semiconductor device at each end of the row. Alternatively, the first retainer wall may contact only a first side of each stacked semiconductor device on a first side of the row and a second side of each semiconductor device on a second side of the row opposite the first side.

The first retainer wall may be shorter than an upper surface of an upper semiconductor device of each one of the first plurality of stacked semiconductor devices. Alternatively, the first retainer wall may be substantially the same height as an upper surface of an upper semiconductor device of at least one of the first plurality of stacked semiconductor devices. Alternatively, the first retainer wall may be higher than an upper surface of an upper semiconductor device of at least one of the first plurality of stacked semiconductor devices.

An upper surface of the first filling may be lower than an upper surface of an upper semiconductor device of each one of the first plurality of stacked semiconductor devices. Alternatively, an upper surface of the first filling may cover an upper surface of an upper semiconductor device of at least one of the first plurality of stacked semiconductor devices.

The first retainer wall may not contact any one of the first plurality of stacked semiconductor devices. The first filling may fill a space between the first retainer wall and the first plurality of stacked semiconductor devices.

The first retainer wall may contact at least a side part of at least one of the first plurality of stacked semiconductor devices.

The semiconductor packaging device may further include a second plurality of stacked semiconductor devices located on a second surface of the substrate opposite the main surface, a second retainer wall adjacent to the second plurality of stacked semiconductor devices, and a second filling to fill spaces defined by the second retainer wall and the second plurality of stacked semiconductor devices.

The second plurality of stacked semiconductor devices may be located at positions on the second surface of the substrate corresponding to locations of the first plurality of stacked semiconductor devices on the main surface of the substrate.

The first plurality of stacked semiconductor devices may be arranged in at least two adjacent rows. The first retainer wall may surround both of the two adjacent rows. Alternatively, the first retainer wall may surround a first row of the two adjacent rows. A second retainer wall may surround a second row of two adjacent rows.

The first retainer wall may include a first surface adjacent to the first plurality of stacked semiconductor devices and a second surface opposite the first surface, and each of the first and second surfaces of the first retainer wall may be perpendicular to the main surface of the substrate. Alternatively, the first surface of the first retainer wall may be perpendicular to the main surface of the substrate, and the second surface of the first retainer wall may be curved such that the first retainer wall is wider at a base adjacent to the substrate than at an end farthest from the substrate.

The material that makes up the first filling may have a higher viscosity than a material that makes up the first retainer wall.

The first retainer wall may include an insulation material, and the first filling may include an insulation material. The first filling may include a material to conduct heat.

Additional features and/or utilities of the present general inventive concept may be realized by a base plate of a semiconductor packaging device, the base plate including a substrate, a plurality of pads on a main surface of the substrate to receive a plurality of semiconductor devices, and a retainer wall area adjacent to the plurality of pads to form a retainer wall thereon.

The retainer wall area may have a rougher surface texture than the rest of the main surface of the substrate. The plurality of pads may include electrically conductive plates mounted on wiring on the substrate. The plurality of pads may include electrically conductive plates embedded in the substrate.

Additional features and/or utilities of the present general inventive concept may be realized by a computing device including a semiconductor packaging device and a controller. The semiconductor packaging device may include a substrate, a plurality of stacked semiconductor devices on the substrate, a retainer wall adjacent to the plurality of stacked semiconductor devices, and a filling to fill spaces defined by the retainer wall and the plurality of stacked semiconductor devices. The controller may control at least one semiconductor device of the plurality of stacked semiconductor devices.

At least one of the stacked semiconductor devices may be memory, and the controller may control a read operation from and a write operation to the memory.

BRIEF DESCRIPTION OF THE DRAWINGS

Example embodiments are described in further detail below with reference to the accompanying drawings. It should be understood that various aspects of the drawings may have been exaggerated for clarity.

These and/or other aspects and utilities of the present general inventive concept will become apparent and more readily appreciated from the following description of the embodiments, taken in conjunction with the accompanying drawings of which:

FIGS. 2A and 2B are schematic perspective views of a portion of the semiconductor packaging device of FIG. 1A;

FIG. 4 is a schematic perspective view of a portion of the semiconductor packaging device of FIG. 1A;

FIG. 5 is a schematic perspective view of a portion of the semiconductor packaging device of FIG. 1A;

FIGS. 6A to 6D are cross-sectional views taken along lines I-I', II-II', III-III', and IV-IV' of FIG. 1A, illustrating an initial step in manufacturing a semiconductor packaging device according to embodiments of the present general inventive concept;

FIGS. 7A to 7D are cross-sectional views taken along lines I-I', II-II', III-III', and IV-IV' of FIG. 1A, illustrating an intermediate step in manufacturing the semiconductor packaging device according to an embodiment of the present general inventive concept;

FIGS. 7E and 7F are cross-sectional views taken along lines I-I' and III-III' of FIG. 1A, illustrating a final step in manufacturing the semiconductor packaging device according to an embodiment of the present general inventive concept;

FIGS. 8A to 8D are cross-sectional views taken along lines I-I', II-II', III-III', and IV-IV' of FIG. 1A, illustrating an intermediate step in manufacturing the semiconductor packaging device according to an embodiment of the present general inventive concept;

FIGS. 9A to 9D are cross-sectional views taken along lines I-I', II-II', and IV-IV' of FIG. 1A, illustrating an intermediate step in manufacturing a semiconductor packaging device according to an embodiment of the present general inventive concept;

DETAILED DESCRIPTION OF THE EMBODIMENTS

Figure 1A:
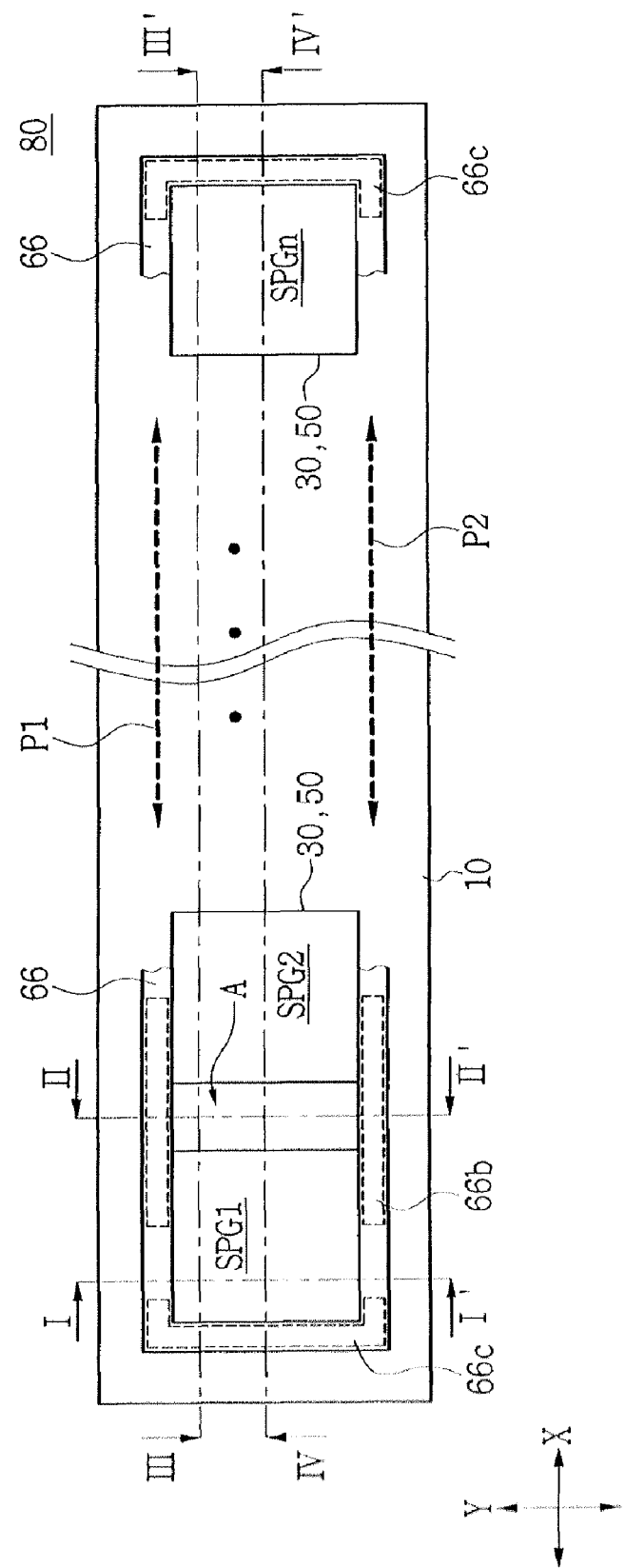
FIGS. 1A-1E illustrate plan views of a semiconductor packaging device according to example embodiments of the present general inventive concept.

Various example embodiments will now be described more fully with reference to the accompanying drawings in which some example embodiments are shown, wherein like reference numerals refer to the like elements throughout. The embodiments are described below to explain the present general inventive concept by referring to the figures. In the drawings, the thicknesses of layers and regions may be exaggerated for clarity.

Detailed illustrative embodiments are disclosed herein. However, specific structural and functional details disclosed herein are merely representative for purposes of describing example embodiments. This general inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the general inventive concept.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation which is above as well as below. For example, a term "filling layer" can be used to describe an "under-fill" in a semiconductor packaging line, and a term "side retainer wall" can be used to describe a "side fill" which aids a filling layer in a semiconductor packaging line. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

To more specifically describe example embodiments, various aspects will be described in detail with reference to the attached drawings. However, the inventive concept is not limited to example embodiments described.

A semiconductor packaging device according to example embodiments will be described with reference to FIGS. 1A-E and 2A-B.

Figure 1B:
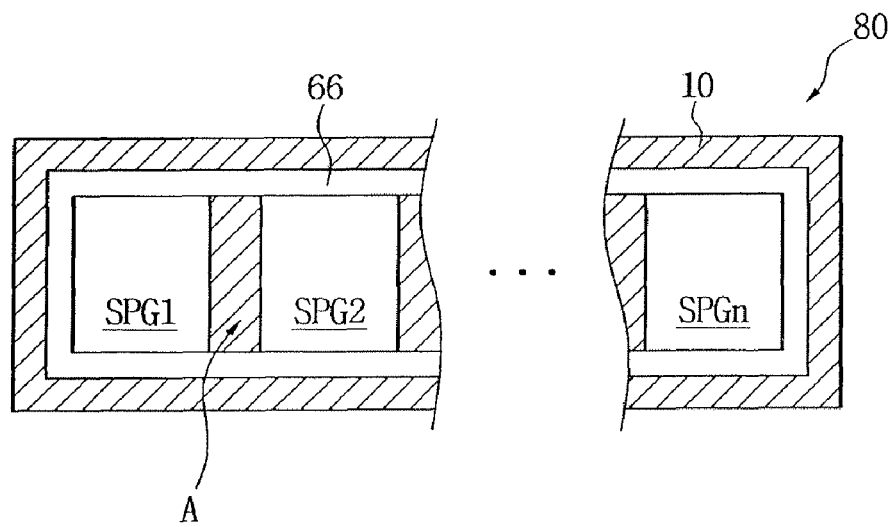
Figure 1C:
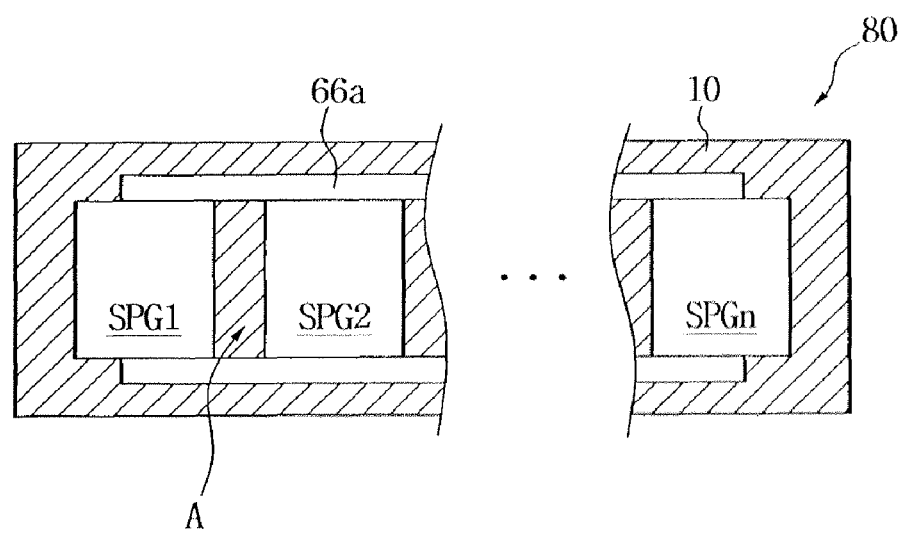
Figure 1D:
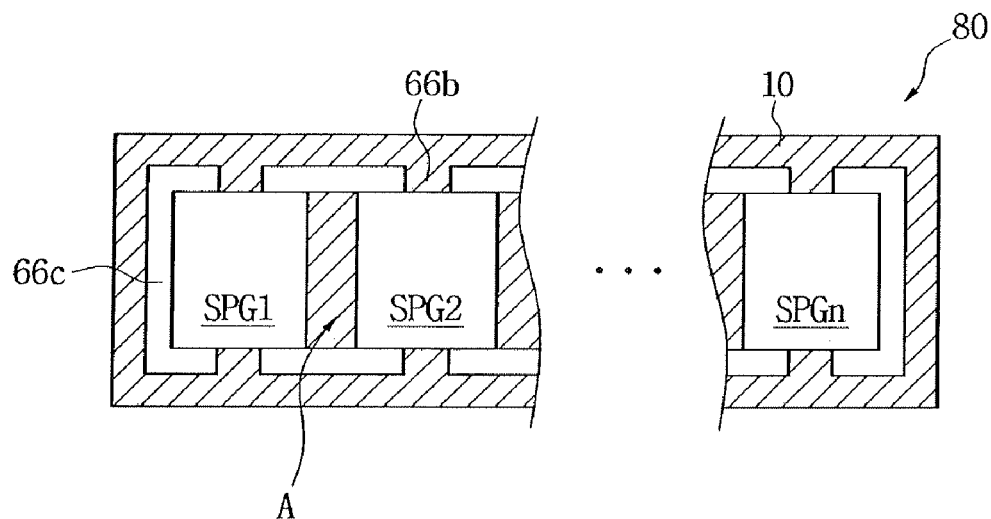
Figure 1E:
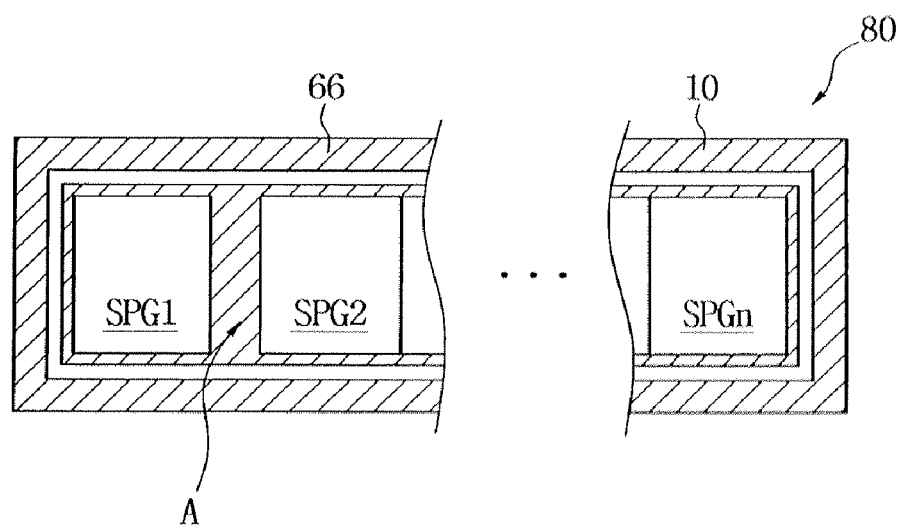
Figure 2A:
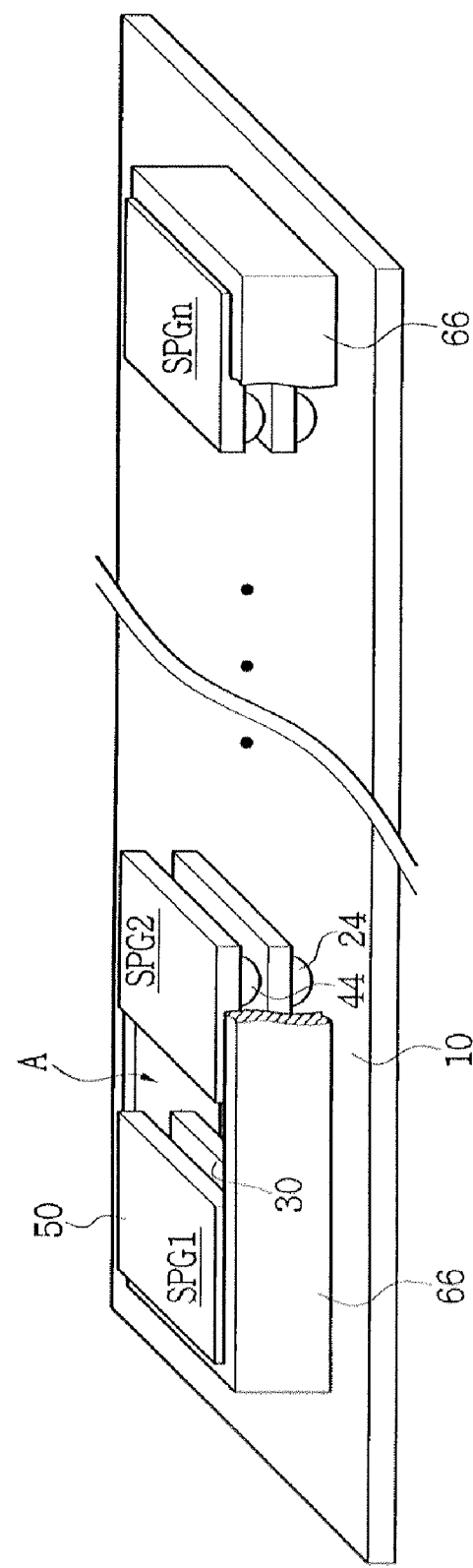

FIGS. 1A-1E are plan views of a semiconductor packaging device according to example embodiments, and FIGS. 2A-2B are schematic perspective views of a portion of the semiconductor packaging device of FIG. 1A.

Referring to FIGS. 1A-1E and 2A-2B, a semiconductor packaging device 80 may include a plurality of semiconductor package groups SPG1 to SPGn located on a main surface of a substrate or base plate 10. The main surface is defined as a first surface upon which semiconductor package groups may be located. It may be substantially planar and of a sufficient size to accommodate a plurality of semiconductor package groups. Semiconductor package groups and other elements may also be located on a second surface opposite the main surface (as shown, for example, in FIG. 7E), although only the main surface is shown in FIGS. 1A-1E. The surface opposite the main surface is the surface on the other side of the base plate 10 as the main surface. The semiconductor package groups on the surface opposite the main surface may be of a same quantity as the semiconductor package groups SPG1 to SPGn, for example. The base plate 10 may be a printed circuit board (PCB). Each of the semiconductor package groups SPG1 to SPGn may include lower and upper semiconductor packages 30 and 50 which may be sequentially stacked as shown in FIGS. 1 and 2.

The lower and upper semiconductor packages 30 and 50 may include the same semiconductor chip or different semiconductor chips, respectively. Each of the semiconductor package groups SPG1 to SPGn may include two or more semiconductor packages. The semiconductor package 30 or 50 of each of the semiconductor package groups SPG1 to SPGn may include bumps 24 and 44. The lower and upper semiconductor packages 30 and 50 may be electrically connected with the base plate 10 through the bumps 24 and 44. The base plate 10 may have pads to electrically connect to the bumps 24 to transmit data, power, or heat to and from the semiconductor package groups SPG1 to SPGn. The semiconductor package groups on the surface opposite the main surface of the base plate 10 may have the same elements as the semiconductor package groups SPG1 to SPGn.

A side retainer wall 66 may be located on the base plate 10 as shown in FIGS. 1A-1E, 2A, and 2B. The side retainer wall 66 may be configured to surround the semiconductor package groups SPG1 to SPGn along guide lines P1 and P2 shown in FIG. 1. The side retainer wall 66 may extend upward from the main surface of the base plate 10 as shown in FIGS. 2A and 2B. The side retainer wall 66 may contact sides of the semiconductor package groups SPG1 to SPGn. The side retainer wall 66 may contact sides of the lower and upper semiconductor packages 30 and 50 of each of the semiconductor package groups SPG1 to SPGn, as shown in FIGS. 1A-1D. Alternatively, the side retainer wall 66 may not contact sides of the semiconductor package groups SPG1 to SPGn, as shown in FIG. 1E.

As shown in FIGS. 1A and 1C, the retainer wall 66 may have side portions to correspond to a length of a row of semiconductor package groups SPG1 to SPGn to restrict the flow of a filling material 70 in a direction Y. As shown in FIGS. 1A and 1D, the retainer wall may also have end portions 66c to restrict the flow of a material in a direction X. As shown in FIGS. 1A and 1B, the retainer wall 66 may entirely surround the semiconductor package groups SPG1 to SPGn to restrict the flow of a filling material 70 in both the direction X and the direction Y.

The filling layer 70 as shown in FIG. 2B and FIGS. 8A to 8F may be contained by the side retainer wall 66 and may be formed on the base plate 10. The filling layer 70 may fill in the area A between the semiconductor package groups SPG1 to SPGn. The filling layer 70 may also fill in the areas between the lower and upper semiconductor packages 30 and 50 of each of the semiconductor package groups SPG1 to SPGn. The filling layer 70 may be defined by the retainer wall 66 to fill an area surrounding the semiconductor package groups SPG1 to SPGn. The filling layer 70 may be formed to expose top surfaces of the semiconductor package groups SPG1 to SPGn. The base plate 10 may have structures of the same form as the side retainer wall 66, the filling layer 70, and the semiconductor package groups SPG1 to SPGn on the surface opposite to the main surface of the base plate 10.

As shown in FIG. 1B, the retainer wall 66 may entirely surround a series of semiconductor package groups SPG1-SPGn. As shown in FIG. 1C, the retainer wall 66 may include only side portions 66a to leave the ends of the series of semiconductor package groups SPG1-SPGn exposed. As shown in FIG. 1D, the retainer wall 66 may include side portions 66b and end portions 66c with spaces located between side portions 66b and other side portions 66b and/or spaces between side portions 66b and the end portions 66c.

Next, a method of manufacturing a semiconductor packaging device according to example embodiments will be described.

Figure 3:
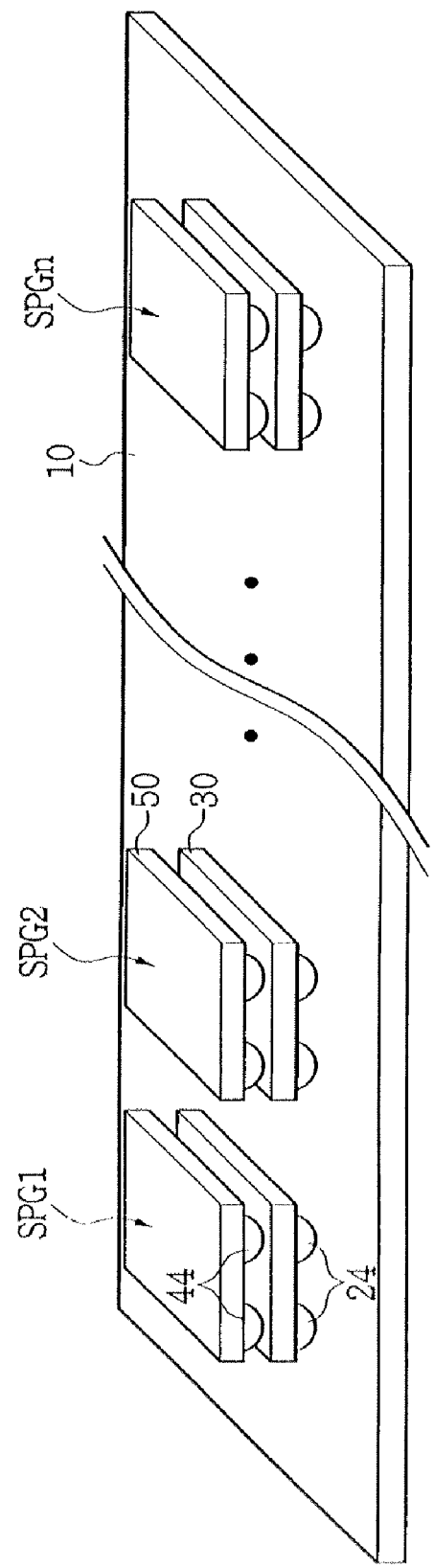
FIG. 3 is a schematic perspective view of semiconductor package groups in the semiconductor packaging device of FIG. 1A.
Figure 6A:
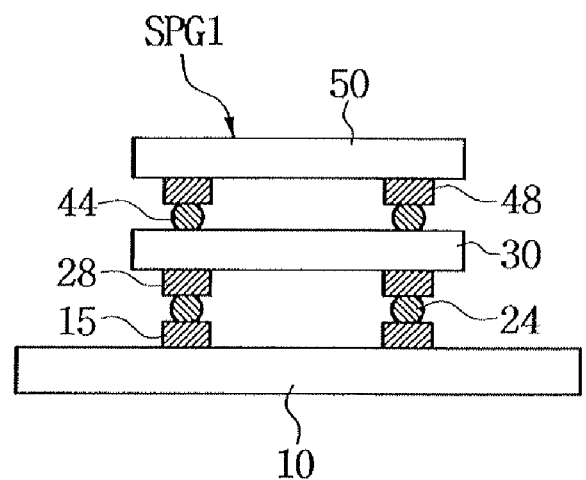
Figure 6B:
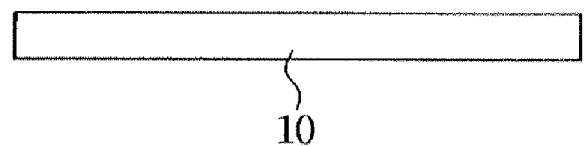

FIG. 3 is a schematic perspective view of the semiconductor package groups of the semiconductor packaging device of FIG. 1A. FIGS. 6A to 6D are cross-sectional views taken along lines I-I', II-II', III-III', and IV-IV' of FIG. 1A, illustrating an initial step in manufacturing a semiconductor packaging device according to example embodiments.

Referring to FIG. 3 and FIGS. 6A to 6D, the base plate 10 may be prepared as shown in FIGS. 6A to 6D. The base plate 10 may include a printed circuit board. The base plate 10 may have interconnections including pads 15 as shown in FIGS. 6A to 6D. The base plate 10 may be made of a flexible material or a non-flexible material. The lower semiconductor packages 30 may be mounted on the base plate 10 as shown in FIG. 3 and FIGS. 6A to 6D. The lower semiconductor packages 30 may include lower bumps 24 and lower pads 28 which protrude from the corresponding semiconductor packages 30 and are sequentially stacked in one or more rows as shown in FIGS. 6A to 6D.

The number of lower bumps 24 may correspond to the number of pads 15. Likewise, the number of lower pads 28 may correspond to the number of lower bumps 24. The lower bumps 24 may contact the pads 15 of the base plate 10 as shown in FIGS. 6A to 6D. Therefore, the pads 15, the lower bumps 24, and the lower pads 28 may electrically connect the base plate 10 to the lower semiconductor packages 30. The pads 15, the lower bumps 24, and the lower pads 28 may be electrically conductive. The upper semiconductor packages 50 may be mounted above the lower semiconductor packages 30, respectively, as shown in FIG. 3 and FIGS. 6A to 6D.

The upper semiconductor package 50 may include upper bumps 44 and upper pads 48 which protrude from the upper semiconductor packages 50 and are sequentially stacked as shown in FIGS. 6A to 6D. The upper bumps 44 may come in contact with corresponding circuits (not shown) of the lower semiconductor packages 30 as shown in FIGS. 6A to 6D. The upper bumps 44 and the upper pads 48 may have electrical conductivity. Therefore, the upper semiconductor packages 50 may be electrically connected to the base plate 10 through the lower semiconductor packages 30.

According to the example embodiments, the lower and upper semiconductor packages 30 and 50 may be included in each of the semiconductor package groups SPG1 to SPGn located on the base plate 10 as shown in FIG. 3 and FIGS. 6A to 6D.

Next, a method of manufacturing a semiconductor packaging device according to example embodiments will be described in further detail.

FIG. 4 is a schematic perspective view of a portion of the semiconductor packaging device of FIGS. 1A and 1D according to an embodiment of the present general inventive concept. FIGS. 7A to 7D are cross-sectional views taken along lines I-I', II-II', III-III', and IV-IV' of FIG. 1A, illustrating an intermediate step in manufacturing the semiconductor packaging device according to an embodiment of the present general inventive concept.

Figure 7A:
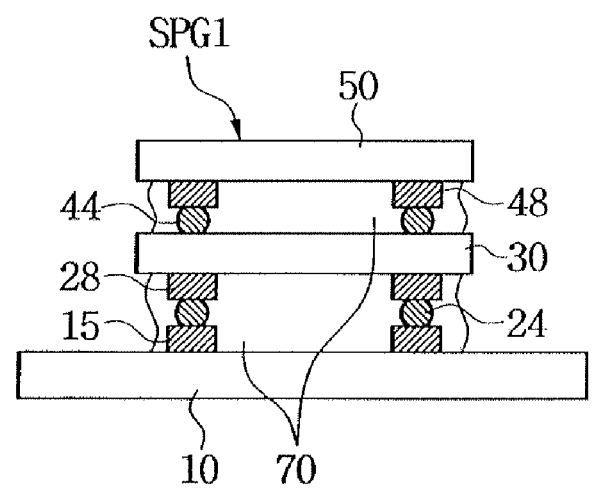
Figure 7B:
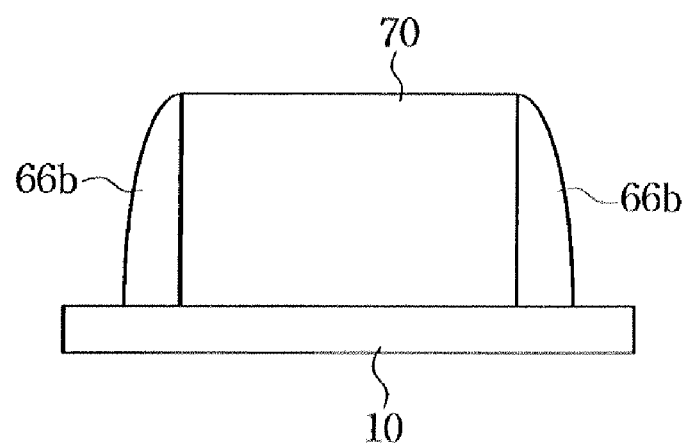
Figure 7E:
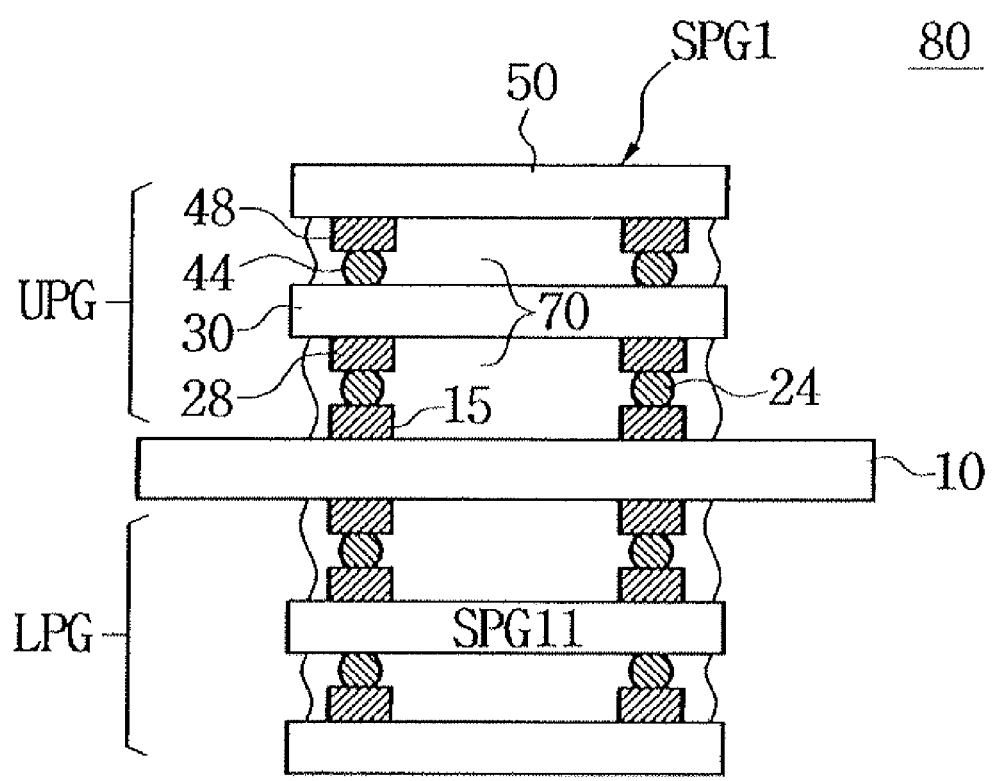

FIGS. 7E and 7F are cross-sectional views taken along lines I-I' and III-III' of FIG. 1A, illustrating a final step in manufacturing the semiconductor packaging device according to an embodiment of the present general inventive concept.

Referring to FIGS. 1A, 1D, 4, and FIGS. 7A to 7D, side retainer walls 66b and 66c may be formed on the base plate 10. The side retainer walls 66b and 66c may be formed along guide lines P1 and P2 as shown in FIG. 1A to be adjacent to the semiconductor package groups SPG1 to SPGn. The side retainer walls 66b and 66c may extend upward from a main surface of the base plate 10. The side retainer walls 66b and 66c may be formed with gaps between adjacent side portions 66b and/or between the side portions 66b and the end portions 66c.

The side retainer walls 66b may be formed along sides of the semiconductor package groups SPG1 to SPGn as shown in FIGS. 1A, 1D, 4, and 7B. Retainer walls 66c may be formed at locations corresponding to the semiconductor package groups SPG1 and SPGn at the ends of a row of semiconductor package groups SPG1 to SPGn as shown in FIGS. 1A, 1D, 4, 7C, and 7D. The side retainer walls 66b and 66c may contact sides of the semiconductor package groups SPG1 to SPGn as shown in FIGS. 4, 7C, and 7D. The side retainer walls 66b and 66c may include a viscous material having insulating properties.

The semiconductor package groups SPG1 to SPGn and the side retainer walls 66b may define spaces A on the base plate 10 as shown in FIGS. 1A, 1D, and 4. A filling layer 70 may be formed on the base plate 10 as shown in FIGS. 7A to 7D. The filling layer 70 may be injected onto the base plate 10 through a dispenser nozzle in a semiconductor packaging assembly line. The filling layer 70 may fill the spaces A while contacting sidewalls of the side retainer walls 66b and 66c. In this manner, the filling layer 70 may be formed between the lower and upper semiconductor packages 30 and 50 of each of the semiconductor package groups SPG1 to SPGn.

The filling layer 70 may include a viscous material having insulating properties. The filling layer 70 may have greater viscosity than the side retainer walls 66b and 66c. The side retainer walls 66b and 66c may control the flow of the filling layer 70 and confine the filling layer 70 within the spaces around the semiconductor package groups SPG1 to SPGn. The side retainer walls 66b and 66c may help to attach the semiconductor package groups SPG1 to SPGn to the base plate 10 by bonding with the filling layer 70. The filling layer 70 may be formed to expose top surfaces of the semiconductor package groups SPG1 to SPGn.

Referring to FIGS. 7E and 7F, the semiconductor package groups SPG1 to SPGn of FIGS. 7A to 7D may be formed on the base plate 10. The semiconductor package groups SPG1 to SPGn, the side retainer walls 66b and 66c, and the filling layer 70 may together form an upper package group UPG located on the main surface of the base plate 10 as shown in FIGS. 7E and 7F. According to an embodiment, a plurality of upper package groups UPG may be mounted in a series on the base plate 10. The upper package groups UPG may include the lower and upper semiconductor packages 30 and 50. The upper package groups may also include additional semiconductor packages stacked on the top semiconductor package 50.

The base plate 10 may have lower package groups LPG mounted onto a surface opposite the main surface of the base plate 10 as shown in FIGS. 7E and 7F. The lower package groups LPG may include a plurality of semiconductor package groups SPG11 to SPGn1. The semiconductor package groups SPG11 to SPGn1 of the lower package group LPG may have the same elements as the semiconductor package groups SPG1 to SPGn of the upper package group UPG. The lower package groups LPG may be mounted in a series on the base plate 10. The lower package group LPG may include the lower and upper semiconductor packages 30 and 50 and may include additional semiconductor packages stacked on the upper semiconductor packages 50.

The semiconductor package groups SPG11 to SPGn1 of the lower package group LPG may have a same quantity as the semiconductor package groups SPG1 to SPGn of the upper package group UPG. Alternatively, the semiconductor package groups SPG11 to SPGn1 of the lower package group LPG may have a different quantity than the semiconductor package groups SPG1 to SPGn of the upper package group UPG. In this manner, the lower package group LPG and the upper package group UPG may make up the semiconductor packaging device 80 together with the base plate 10 as shown in FIGS. 7E and 7F.

FIG. 5 is a schematic perspective view of a portion of the semiconductor packaging device of FIGS. 1A and 1B according to an embodiment of the present general inventive concept. FIGS. 8A to 8D are cross-sectional views taken along lines I-I', II-II', III-III', and IV-IV' of FIG. 1, illustrating an intermediate step in manufacturing the semiconductor packaging device according to an embodiment of the present general inventive concept.

Figure 8A:
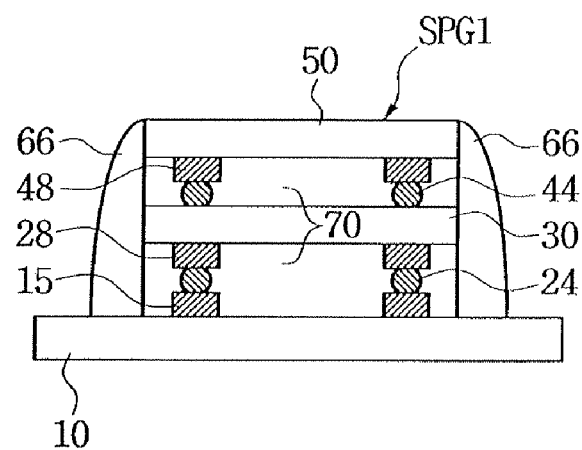
Figure 8B:
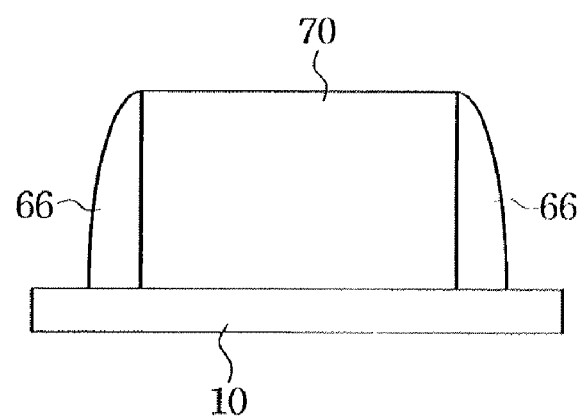
Figure 8E:
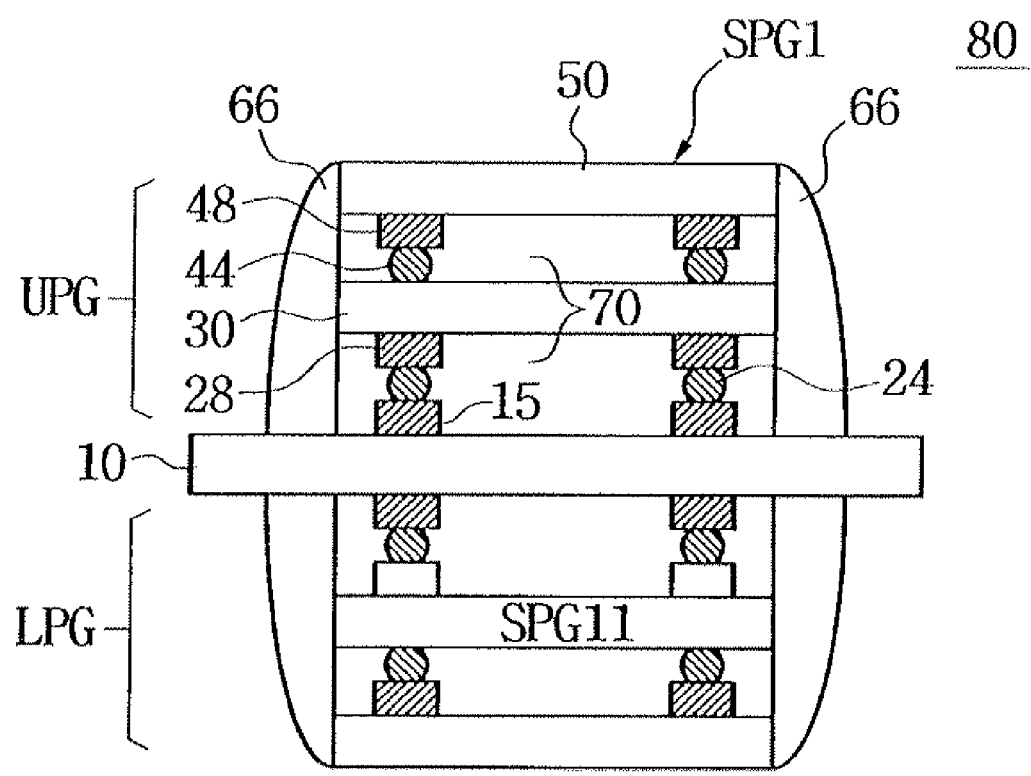
FIGS. 8E and 8F are cross-sectional views taken along lines I-I' and III-III' of FIG. 1A, illustrating a final step in manufacturing the semiconductor packaging device according to an embodiment of the present general inventive concept.
Figure 8F:
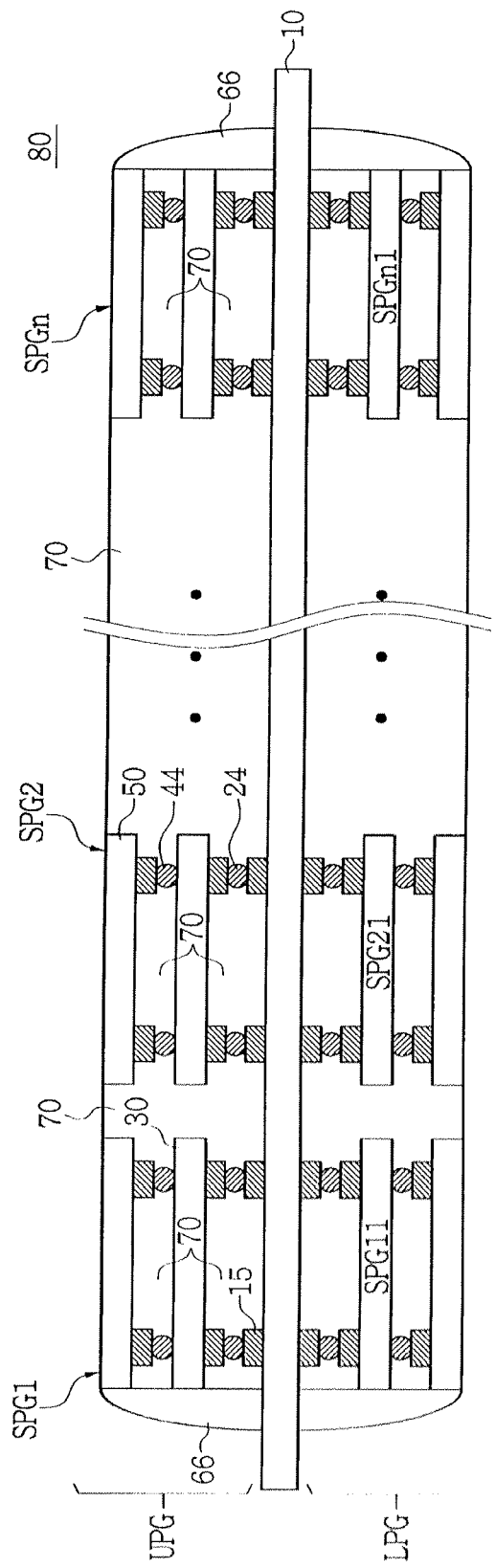

FIGS. 8E and 8F are cross-sectional views taken along lines I-I' and III-III' of FIG. 1A, illustrating a final step in manufacturing the semiconductor packaging device according to an embodiment of the present general inventive concept.

Referring to FIG. 5 and FIGS. 8A to 8D, a side retainer wall 66 may be formed on the base plate 10. The side retainer wall 66 may be formed along guide lines P1 and P2 as shown in FIG. 1A to entirely surround the semiconductor package groups SPG1 to SPGn. The side retainer wall 66 may extend upward from the main surface of the base plate 10. As such, the side retainer wall 66 may come in contact with sides of the semiconductor package groups SPG1 to SPGn as shown in FIGS. 5, 8A, 8C, and 8D. The side retainer wall 66 may include a viscous material having insulating properties.

The semiconductor package groups SPG1 to SPGn and the retainer walls 66 may define spaces A as shown in FIGS. 1A and 5. A filling layer 70 may be formed on the base plate 10 as shown in FIGS. 8A to 8D. The filling layer 70 may fill the spaces A while contacting sidewalls of the side retainer walls 66. As such, the filling layer 70 may be formed between the lower and upper semiconductor packages 30 and 50 of each of the semiconductor package groups SPG1 to SPGn. The filling layer 70 may have greater viscosity than the side retainer walls 66. The side retainer walls 66 may control the flow of the filling layer 70 and confine the filling layer 70 within the area around the semiconductor package groups SPG1 to SPGn. The side retainer walls 66 may help to attach the semiconductor package groups SPG1 to SPGn to the base plate 10.

Referring to FIGS. 8E and 8F, the semiconductor package groups SPG1 to SPGn of FIGS. 8A to 8D may be formed on the base plate 10. The semiconductor package groups SPG1 to SPGn may be included together with the side retainer walls 66 and the filling layer 70 as an upper package group UPG located on the main surface of the base plate 10 as shown in FIGS. 8E and 8F. A plurality of upper package groups UPG may be mounted in series on the base plate 10. The upper package groups UPG may include the lower and upper semiconductor packages 30 and 50 and may include additional semiconductor packages stacked on the upper semiconductor packages 50.

The base plate 10 may include a lower package group LPG located on the surface opposite the main surface of the base plate 10 as shown in FIGS. 8E and 8F. The lower package groups LPG may include a plurality of semiconductor package groups SPG11 to SPGn1. The semiconductor package groups SPG11 to SPGn1 of the lower package group LPG may have the same elements as the semiconductor package groups SPG1 to SPGn of the upper package groups UPG. The lower package groups LPG may be mounted in series on the base plate 10. The lower package groups LPG may include the lower and upper semiconductor packages 30 and 50 and may include additional semiconductor packages stacked on the upper semiconductor packages 50.

FIGS. 9A to 9D are cross-sectional views taken along lines I-I', II-II', III-III', and IV-IV' of FIG. 1A, illustrating an intermediate step in manufacturing a semiconductor packaging device according to an embodiment of the present general inventive concept.

Figure 9A:
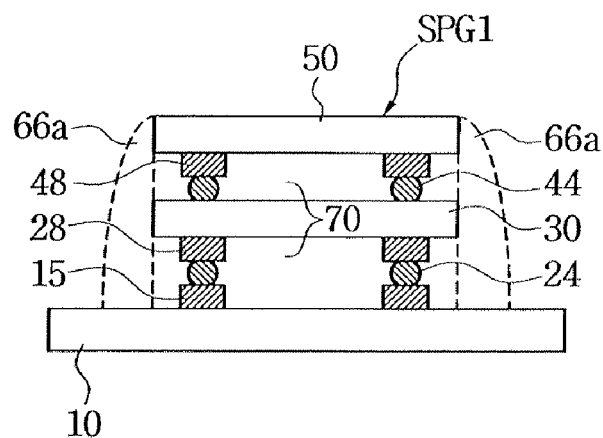
Figure 9B:
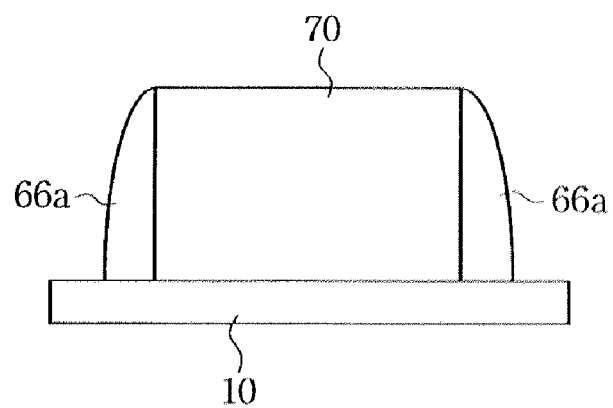
Figure 9E:
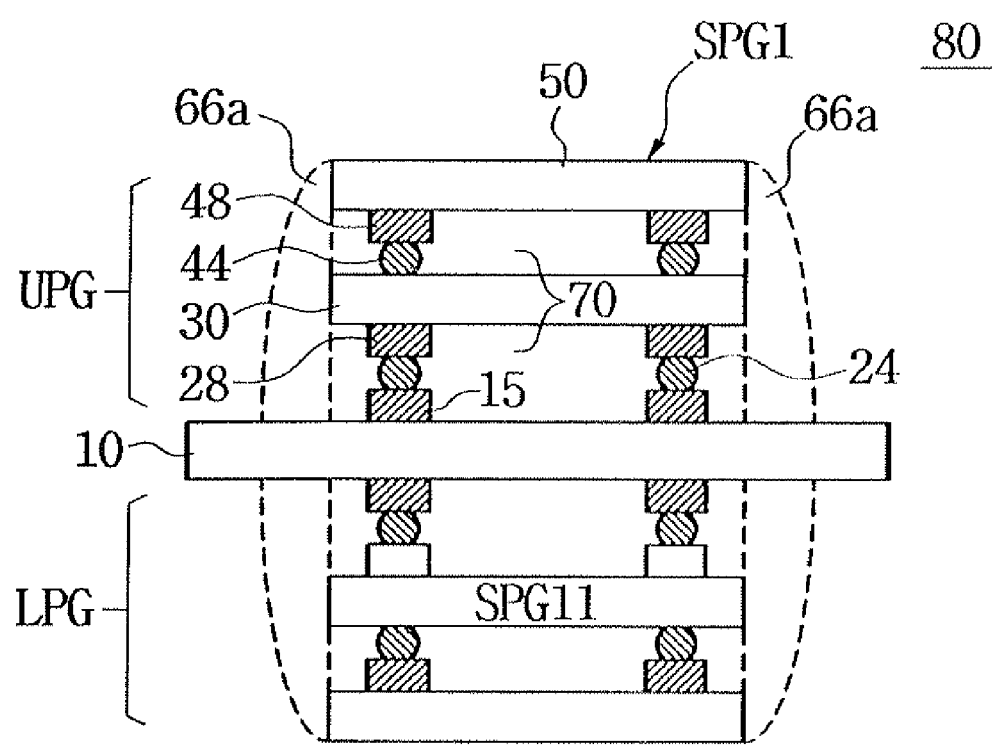
FIGS. 9E and 9F are cross-sectional views taken along lines I-I' and III-III' of FIG. 1A, illustrating a final step in manufacturing the semiconductor packaging device according to an embodiment of the present general inventive concept.
Figure 9F:
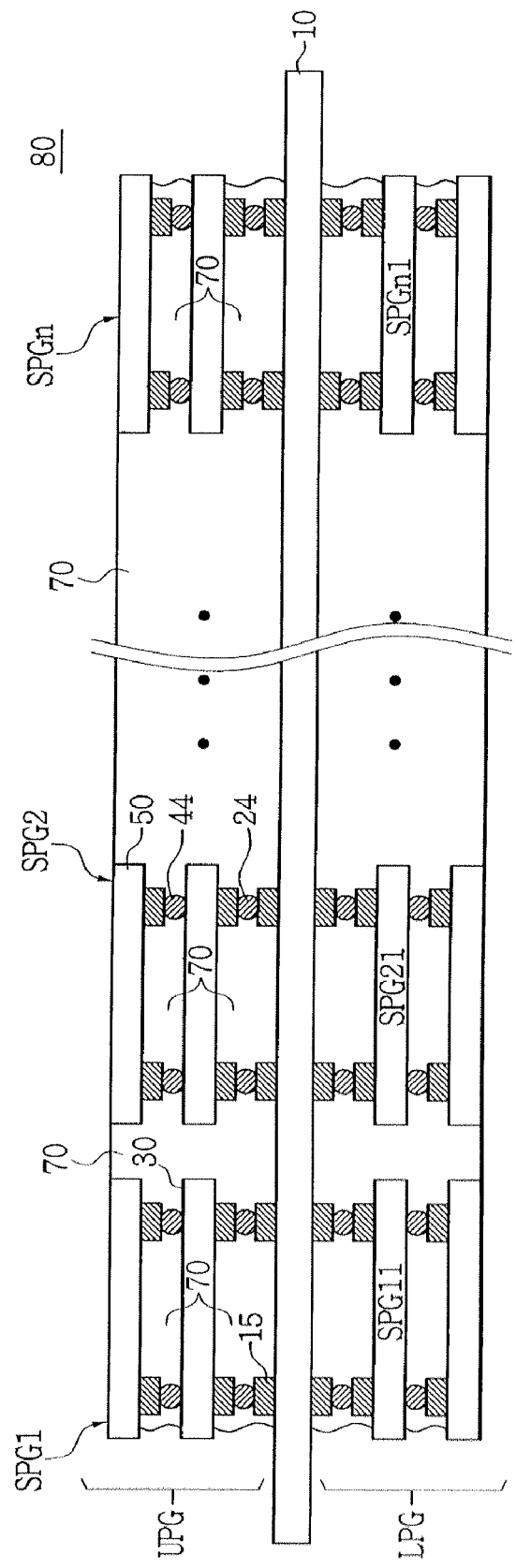

FIGS. 9E and 9F are cross-sectional views taken along lines I-I' and III-III' of FIG. 1A, illustrating a final step in manufacturing the semiconductor packaging device according to an embodiment of the present general inventive concept.

Referring to FIGS. 1A, 1C, and 9A to 9D, side retainer walls 66a may be formed on the base plate 10 as shown in FIGS. 1A, 1C, and 9B. The side retainer walls 66c of FIGS. 1D and 4 are not formed at the ends of the series of semiconductor package groups SPG1-SPGn. The side retainer walls 66a may be formed along guide lines P1 and P2 as shown in FIG. 1A to be adjacent to the semiconductor package groups SPG1 to SPGn. The side retainer walls 66a may extend upward from the main surface of the base plate 10 as shown in FIG. 9B. The side retainer walls 66a may contact the sides of the semiconductor package groups SPG1 to SPGn as shown in FIG. 4.

The side retainer walls 66a may be formed along guide lines P1 and P2 on the sides of the semiconductor package groups SPG1 to SPGn as shown in FIGS. 9A and 9B. The semiconductor package groups SPG1 to SPGn and the side retainer walls 66a may define spaces A as shown in FIGS. 1A, 1C, and 4. Subsequently, a filling layer 70 may be formed on the base plate 10 as shown in FIGS. 9A to 9D. The filling layer 70 may fill the spaces A while contacting sidewalls of the side retainer walls 66a. The filling layer 70 may fill the spaces between the lower and upper semiconductor packages 30 and 50 of each of the semiconductor package groups SPG1 to SPGn. The side retainer walls 66a may control the flow of the filling layer 70 and confine the filling layer 70 to the area surrounding the semiconductor package groups SPG1 to SPGn.

Referring to FIGS. 9E and 9F, the semiconductor package groups SPG1 to SPGn of FIGS. 9A to 9D may be formed on the base plate 10. The semiconductor package groups SPG1 to SPGn, the side retainer walls 66a, and the filling layer 70 may together form an upper package group UPG located on the main surface of the base plate 10 as shown in FIGS. 9E and 9F. A plurality of upper package groups UPG may be formed in series on the base plate 10. The upper package groups UPG may include the lower and upper semiconductor packages 30 and 50 and may also include additional semiconductor packages stacked on the upper semiconductor packages 50.

The base plate 10 may include a lower package group LPG located on the surface opposite the main surface of the base plate 10 as shown in FIGS. 9E and 9F. The lower package groups LPG may include a plurality of semiconductor package groups SPG11 to SPGn1. The semiconductor package groups SPG11 to SPGn1 of the lower package group LPG may have the same elements as the semiconductor package groups SPG1 to SPGn of the upper package groups UPG. The lower package groups LPG may be formed in series on the base plate 10. The lower package groups LPG may include the lower and upper semiconductor packages 30 and 50 and may also include additional semiconductor packages stacked on the upper semiconductor packages 50.

The lower package group LPG, the upper package group UPG, and the base plate 10 may together form the semiconductor packaging device 80, as shown in FIGS. 9E and 9F.

FIGS. 10A-10D illustrate a method to manufacture a semiconductor packaging device 80 according to an embodiment of the present general inventive concept.

Figure 10A:
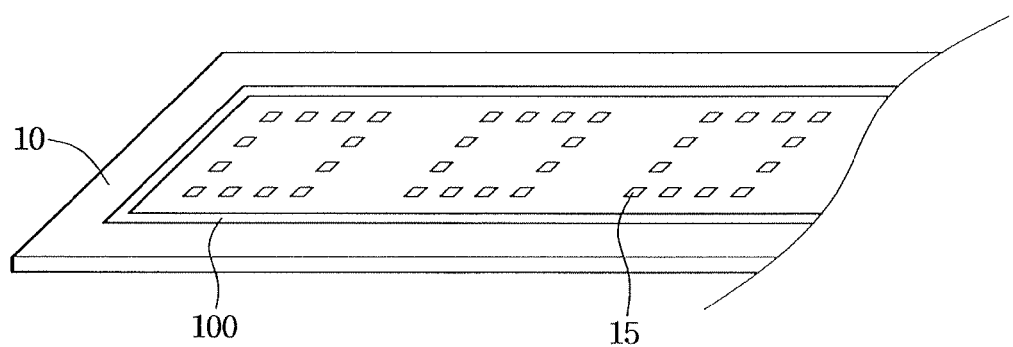
FIGS. 10A-10D illustrate a method to form a semiconductor packaging device of the present general inventive concept.

As shown in FIG. 10A, a substrate 10 may be provided. The substrate may be a printed circuit board, for example. The substrate may include pads 15 and a retainer wall area 100. The pads 15 may be configured to receive a plurality of semiconductor packages or devices in a row or in series. The pads 15 may be further configured to receive semiconductor packages in a plurality of rows. The pads may be raised above a surface of the substrate 10 or they may have an upper surface flush, or substantially flush, with an upper surface of the substrate 10. For example, substrate material may be removed from the surface of the substrate 10 and a pad 15 may be embedded therein.

Figure 10B:
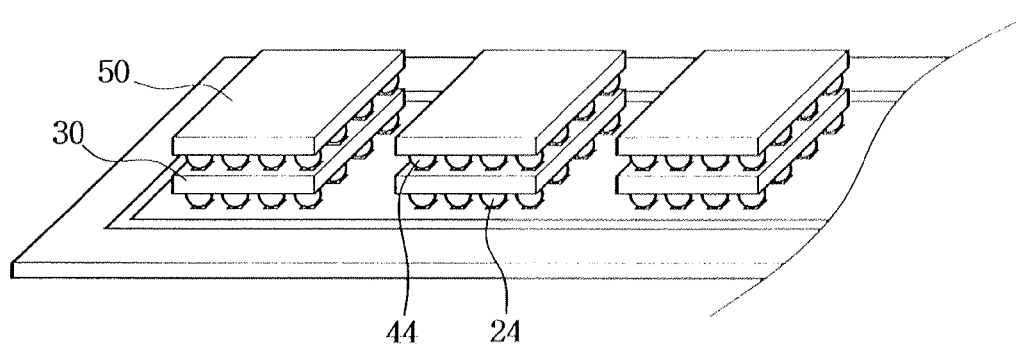

As shown in FIG. 10B, semiconductor packages 30, 50 may be mounted on the pads 15 via conductive bumps, electrodes, or leads 24, 44. Specifically, a semiconductor package 30 may be mounted directly on the pads 15 via bumps 24, and a semiconductor package 50 may be mounted upon the semiconductor package 30 via bumps 44. Although only two semiconductor packages are shown in FIG. 10B, and number of semiconductor packages may be stacked. In addition, the semiconductor packages 30, 50 may be stacked together either before or after the semiconductor package 30 is mounted to the substrate 10.

Figure 10C:
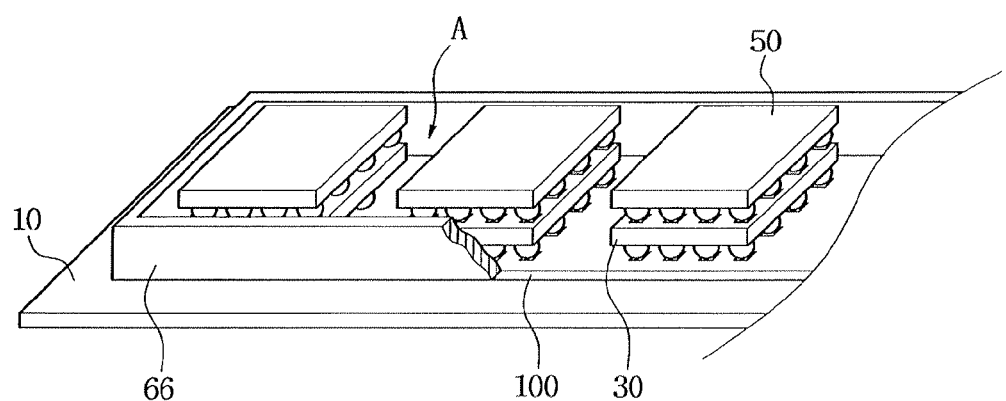

As shown in FIG. 10C, a retainer wall 66 may be formed on the retainer wall area 100. The retainer wall area 100 may have a surface distinct from other areas of the substrate surface. For example, the retainer wall area 100 may be rougher than surrounding areas or may comprise a substance coated on the substrate 10 to facilitate bonding between the retainer wall area 100 and the material that makes up the retainer wall 66. The retainer wall 66 may be formed to a height lower than or equal to an upper surface of the upper semiconductor package 50. Alternatively, the retainer wall may be formed to a height above an upper surface of the upper semiconductor package 50.

Although FIG. 10C illustrates a retainer wall 66 that is spaced from, or not directly adjacent to, the semiconductor packages, 30, 50, the retainer wall 66 may also be directly adjacent to the semiconductor packages 30, 50 so that it may contact the semiconductor packages. If the semiconductor packages 30, 50 are of different sizes, the retainer wall 66 may be directly adjacent to one semiconductor package and spaced a certain distance from the other.

Figure 11A:
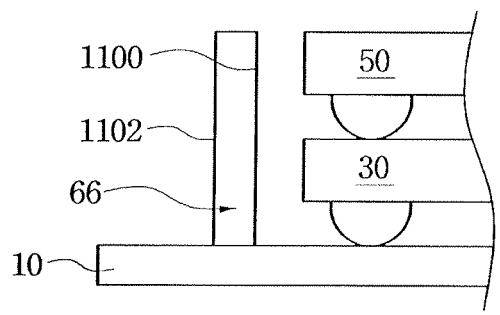
FIGS. 11A-11C illustrate embodiments of a retainer wall according to the present general inventive concept.
Figure 11B:
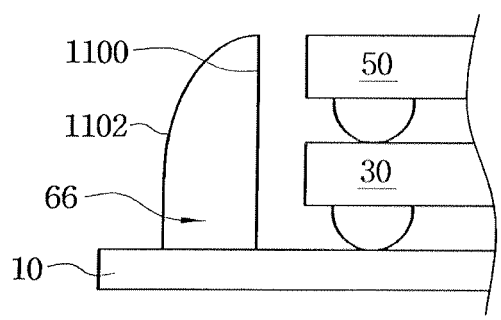
Figure 11C:
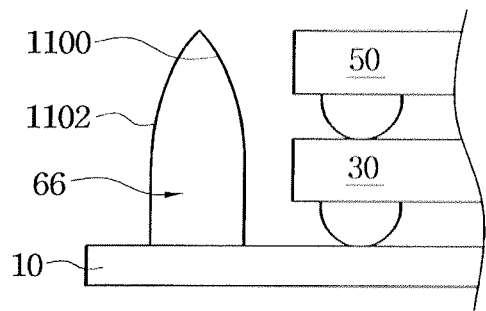

As shown in FIGS. 11A-11C, respectively, the retainer wall 66 may be formed into any shape, including having a straight inside surface 1100 adjacent to the semiconductor devices 30, 50 and a straight outside surface 1102; having a straight inside surface 1100 and a curved outside surface 1102, or having a curved inside surface 1100 and a curved outside surface 1102.

Figure 10D:
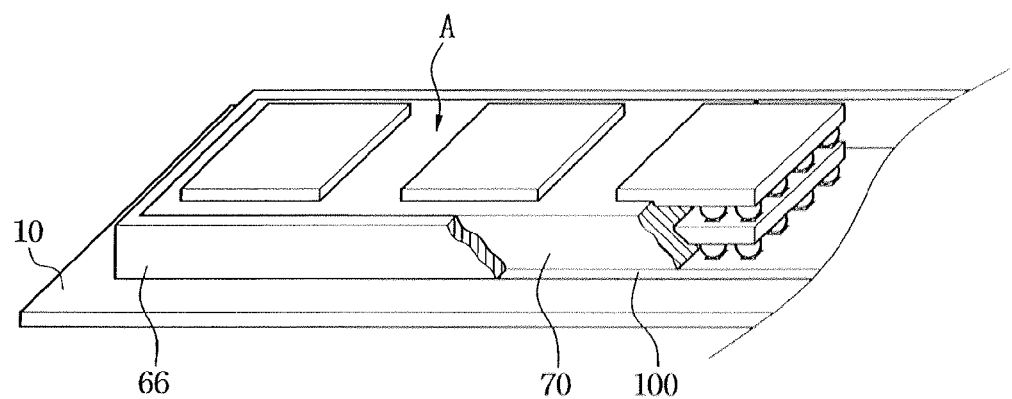

After forming the retainer wall 66, the space defined by the retainer wall 66 and the semiconductor packages 30, 50 may be filled in with a filling 70. FIG. 10D illustrates a perspective view of a portion of the semiconductor packaging device 80 of FIG. 1A with portions of the retaining wall 66 and filling 70 cut away for clarity. The filling may fill the spaces A between semiconductor package groups, such as SPG1 and SPG2, and between individual semiconductor packages 30, 50 of the semiconductor package groups. When the retainer wall 66 is spaced a certain distance from the semiconductor packages 30, 50, the filling may also fill the space between the semiconductor packages 30, 50 and the retainer wall 66.

When the retainer wall 66 is shorter or of an equal height as an upper surface of the upper semiconductor package 50, the filling leaves the upper surface of the upper semiconductor package 50 exposed. However, when the retainer 66 is taller than a height of the upper surface of the upper semiconductor package 50, the filling may partially or entirely cover the upper surface of the upper semiconductor package 50.

The filling material 70 may include an insulation material and/or a heat conductive material to dissipate heat from the semiconductor packages 30, 50. The insulation material may physically insulate the semiconductor packages 30, 50 from physical shock or it may prevent electrical transmission through the filling material 70. The filling material 70 may include a bonding agent such as cement to affix the semiconductor packages 30, 50 to the substrate 10 and/or to the retaining wall 66. The filling material 70 may have a viscosity greater than that of the retainer wall 66. As such, the filling material 70 may form the LPG and UPG of FIGS. 8E and 8F together with the substrate 10, the semiconductor packages 30 and 50, and the retainer wall 66. The LPG and UPG may be formed as the semiconductor packaging device 80 of FIGS. 8E and 8F.

Figure 12A:
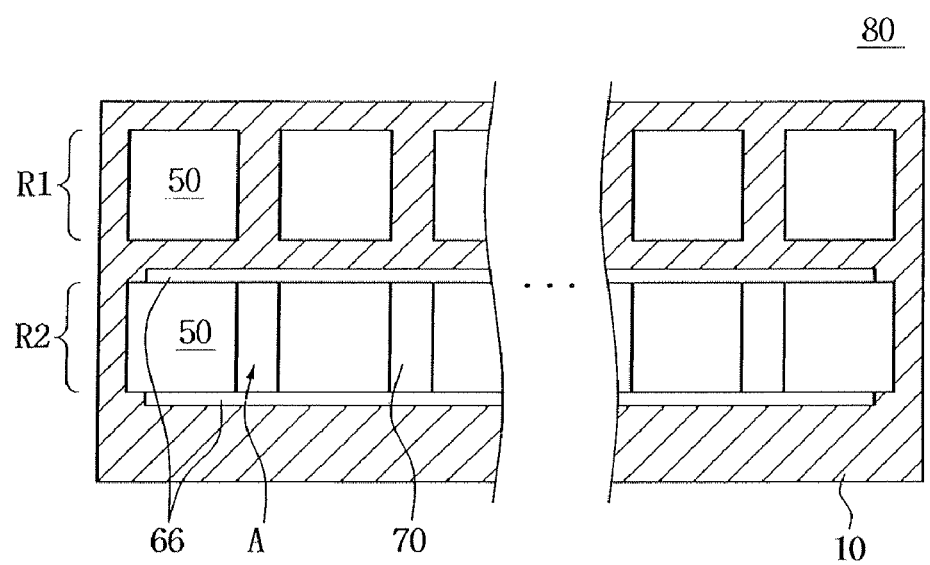
FIGS. 12A and 12B illustrate plan views of a semiconductor packaging device having semiconductor devices arranged in rows according to the present general inventive concept.
Figure 12B:
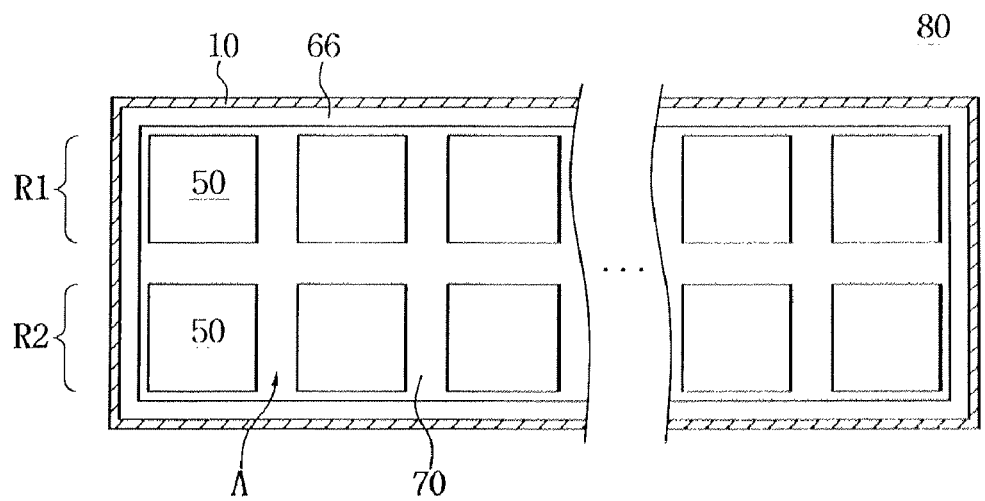

FIGS. 12A and 12B illustrate stacked semiconductor packages arranged in rows of the semiconductor packaging device 80. As shown in FIG. 12A, a first row R1 of stacked semiconductor packages is arranged adjacent to a second row R2 of stacked semiconductor packages on the substrate 10. A retainer wall 66 is adjacent to only one of the rows R2. Although the retainer wall 66 illustrated in FIG. 12A is adjacent to only the sides of the row R2, the retainer wall 66 may have any configuration, as illustrated in FIGS. 1A-1E. As discussed previously, filler 70 may fill the spaces A between the stacked semiconductor packages.

FIG. 12B illustrates the rows R1 and R2 of FIG. 12A, but the retainer wall 66 surrounds both the first row R1 and the second row R2. When there are more than two rows, the retainer wall 66 may surround any of the rows and may exclude any of the rows. Specifically, the retainer wall 66 may be formed adjacent to any rows that are to receive filling 70, and may not be formed adjacent to rows that are not to receive filling 70. Alternatively, the retainer wall 66 may not be formed adjacent to rows that receive filling 70.

Figure 13A:
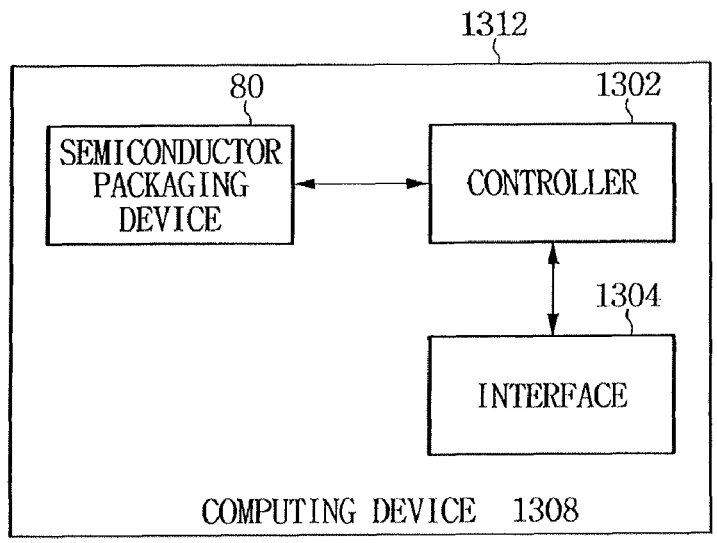
FIG. 13A illustrates a block diagram of a computing device having a semiconductor packaging device according to an embodiment of the present general inventive concept.

Referring to FIGS. 1A and 13A, FIG. 13A illustrates a computing device 1300 including a semiconductor packaging device 80 according to an embodiment of the present general inventive concept, a controller 1302, and an interface 1304. The controller 1302 may access an individual semiconductor device, such as the stacked semiconductor devices 30, 50 discussed above, of the semiconductor packaging device. For example, the semiconductor devices 30, 50 may be memory to store data or a semiconductor device to manipulate data, such as a multiplexing device or another controller. The controller 1302 may receive commands from an interface 1304, which may include a user interface such as a display and keypad, or may include a port to receive commands from an external device, for example. The controller may be electrically connected to pads on the substrate 10 of the semiconductor packaging device 80, or pads located on an exposed upper surface of one of the stacked semiconductor devices 50, for example.

For example, if the computing device 1300 receives a command from an external device via the interface 1304 to access memory located in the semiconductor packaging device 80, the interface 1304 may transmit the command to the controller 1302 which may access any of the stacked semiconductor devices 30, 50 in the semiconductor packaging device 80 to read data and to transmit the data to the external device via the interface 1304.

The computing device 1300 may be enclosed by a physical housing 1312, or it may include a plurality of devices electrically connected together. For example, the interface 1304 may be integral with the computing device 1300, or it may be externally connected to the computing device 1300.

Figure 13B:
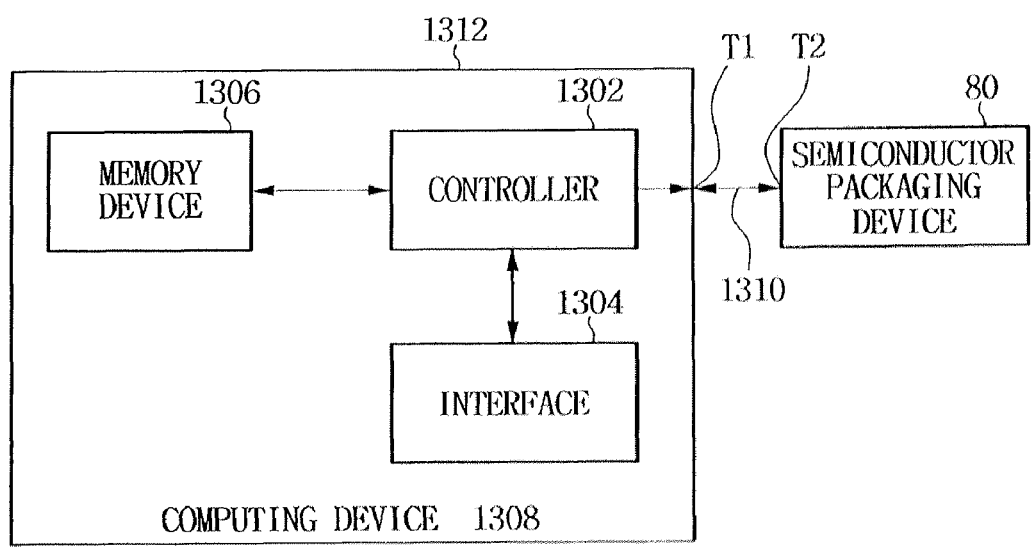
FIG. 13B illustrates a block diagram of a computing device connected to a semiconductor packaging device according to an embodiment of the present general inventive concept.

FIG. 13B illustrates a computing device 1308 connected to a semiconductor packaging device 80 according to an embodiment of the present general inventive concept. Similar to the computing device 1300 in FIG. 13A, the computing device 1308 may include a controller 1302 and an interface 1304. The computing device 1308 may further include a memory device to receive data from the controller 1302 or another source. The computing device 1308 may include a terminal T1 to connect to an external device, such as the semiconductor packaging device 80. The semiconductor packaging device 80 may have a terminal T2 directly formed on the device, or it may be connected to a terminal T2. Numeral 1310 represents a connection between terminals T1 and T2, and may include a hard connection including a physical wire, or a wireless connection. For example, both the computing device 1308 and the semiconductor packaging device 80 may be connected to a wireless transceiver to transmit and/or receive data wirelessly.

Alternatively, the computing device 1308 may be connected to the semiconductor packaging device 80 via a physical wire. The wire may be directly connected to a terminal T2 formed on the semiconductor packaging device to allow the computing device 1308 to access data on or otherwise control or access the semiconductor packages located on the semiconductor packaging device 80.

Alternatively, the controller 1302 may be one of the stacked semiconductor devices 30, 50, and the interface may be connected directly to the semiconductor packaging device 80.

As described above, example embodiments provide a semiconductor packaging device in which at least one side retainer wall is located adjacent to semiconductor package groups on the base plate. The at least one side retainer wall may confine a filling layer within the semiconductor package groups and may expose top surfaces of the semiconductor package groups. Therefore, the at least one side retainer wall may provide a better mounting environment for elements of electronic devices together with the base plate, the filling layer and the semiconductor package groups, compared to the conventional semiconductor packaging device.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A semiconductor packaging device comprising:
a base plate;
a plurality of first semiconductor package groups located on the base plate;
a side retainer wall configured to extend upward from a main surface of the base plate and surround the first semiconductor package groups, the side retainer wall having a first side part on a first side of the first semiconductor package groups and a second side part on a second side of the first semiconductor package groups opposite the first side; and
a filling layer to fill an area between the first and second side parts of the side retainer wall between the respective first semiconductor package groups, wherein
the first side part has at least one first gap formed therein and the second side part has at least one second gap formed therein, and
the at least one first and second gaps do not overlap a space between the plurality of first semiconductor package groups.

2. The semiconductor packaging device of claim 1, wherein each of the first semiconductor package groups comprises semiconductor packages which are stacked one on top of the other, the side retainer wall contacts sides of the first semiconductor package groups, and the filling layer is located between the semiconductor packages of each of the first semiconductor package groups.

3. The semiconductor packaging device of claim 1, further comprising, a plurality of second semiconductor package groups located on a surface opposite to the main surface of the base plate.

4. The semiconductor packaging device of claim 1, wherein the base plate includes an area configured to accept the side retainer wall, the area having a surface distinct from other areas of the base plate.

5. The semiconductor packaging device of claim 4, wherein the surface distinct from the other areas of the base plate is rougher than the other areas of the base plate.

6. The semiconductor packaging device of claim 4, wherein the area configured to accept the side retainer wall includes a bonding agent to bond the side retainer wall to the area configured to accept the side retainer wall.

7. A semiconductor packaging device comprising:
a base plate;
a plurality of first semiconductor package groups located on the base plate;
side retainer walls configured to extend upward from a main surface of the base plate and located along first and second sides of the first semiconductor package groups; and
a filling layer configured to contact the side retainer walls and located between the respective first semiconductor package groups, wherein
the side retainer walls have at least one gap formed therein, and
the at least one gap does not overlap a space between the plurality of first semiconductor package groups.

8. The semiconductor packaging device of claim 7, wherein each of the first semiconductor package groups comprises semiconductor packages which are stacked one on top of the other,
the side retainer walls contact sides of the first semiconductor package groups, and
the filling layer is located between the respective semiconductor packages of each of the first semiconductor package groups.

9. The semiconductor packaging device of claim 7, further comprising:
a plurality of second semiconductor package groups located on a surface opposite to the main surface of the base plate.

10. A semiconductor packaging device, comprising:
a substrate;
a first plurality of stacked semiconductor devices on a first surface of the substrate;
a first retainer wall adjacent to the first plurality of stacked semiconductor devices; and
a first filling to fill spaces defined by the first retainer wall and the first plurality of stacked semiconductor devices, wherein
the first retainer wall has at least one gap formed therein, and
the at least one gap does not overlap a space between the first plurality of stacked semiconductor devices.

11. The semiconductor packaging device according to claim 10, wherein the first retainer wall is located along only a first side of the first plurality of semiconductor devices and a second side opposite the first side.

12. The semiconductor packaging device according to claim 10, wherein the first retainer wall entirely surrounds the first plurality of stacked semiconductor devices.

13. The semiconductor packaging device according to claim 10, wherein the first plurality of stacked semiconductor devices is arranged in a row on the substrate.

14. The semiconductor packaging device according to claim 13, wherein the first retainer wall comprises at least a first side portion on a first side of the first plurality of stacked semiconductor devices, at least a second side portion on a second side of the first plurality of stacked semiconductor devices, and at least one end portion at each end of the row of stacked semiconductor devices, and the first retainer wall has at least one gap between two adjacent side portions, or between a side portion and an adjacent end portion.

15. The semiconductor packaging device according to claim 13, wherein the first retainer wall contacts a first side of each stacked semiconductor device on a first side of the row, a second side of each semiconductor device on a second side of the row opposite the first side, and a side of each stacked semiconductor device at each end of the row.

16. The semiconductor packaging device according to claim 13, wherein the first retainer wall contacts only a first side of each stacked semiconductor device on a first side of the row and a second side of each semiconductor device on a second side of the row opposite the first side.

17. The semiconductor packaging device according to claim 10, wherein the first retainer wall is shorter than an upper surface of an upper semiconductor device of each one of the first plurality of stacked semiconductor devices.

18. The semiconductor packaging device according to claim 10, wherein the first retainer wall is substantially the same height as an upper surface of an upper semiconductor device of at least one of the first plurality of stacked semiconductor devices.

19. The semiconductor packaging device according to claim 10, wherein the first retainer wall is higher than an upper surface of an upper semiconductor device of at least one of the first plurality of stacked semiconductor devices.

20. The semiconductor packaging device according to claim 10, wherein an upper surface of the first filling is lower than an upper surface of an upper semiconductor device of each one of the first plurality of stacked semiconductor devices.

21. The semiconductor packaging device according to claim 10, wherein an upper surface of the first filling covers an upper surface of an upper semiconductor device of at least one of the first plurality of stacked semiconductor devices.

22. The semiconductor packaging device according to claim 10, wherein the first retainer wall does not contact any one of the first plurality of stacked semiconductor devices.

23. The semiconductor packaging device according to claim 22, wherein the first filling fills a space between the first retainer wall and the first plurality of stacked semiconductor devices.

24. The semiconductor packaging device according to claim 10, wherein the first retainer wall contacts at least a side part of at least one of the first plurality of stacked semiconductor devices.

25. The semiconductor packaging device according to claim 10, further comprising:

a second plurality of stacked semiconductor devices located on a second surface of the substrate opposite the main surface;

a second retainer wall adjacent to the second plurality of stacked semiconductor devices; and a second filling to fill spaces defined by the second retainer wall and the second plurality of stacked semiconductor devices.

26. The semiconductor packaging device according to claim 25, wherein the second plurality of stacked semiconductor devices is located at positions on the second surface of the substrate corresponding to locations of the first plurality of stacked semiconductor devices on the main surface of the substrate.

27. The semiconductor packaging device according to claim 10, wherein the first plurality of stacked semiconductor devices is arranged in at least two adjacent rows.

28. The semiconductor packaging device according to claim 27, wherein the first retainer wall surrounds both of the two adjacent rows.

29. The semiconductor packaging device according to claim 27, wherein the first retainer wall surrounds a first row of the two adjacent rows.

30. The semiconductor packaging device according to claim 29, further comprising a second retainer wall surrounding a second row of two adjacent rows.

31. The semiconductor packaging device according to claim 10, wherein the first retainer wall includes a first surface adjacent to the first plurality of stacked semiconductor devices and a second surface opposite the first surface, each of the first and second surfaces of the first retainer wall is perpendicular to the main surface of the substrate.

32. The semiconductor packaging device according to claim 10, wherein the first retainer wall includes a first surface adjacent to the first plurality of stacked semiconductor devices and a second surface opposite the first surface, the first surface of the first retainer wall is perpendicular to the main surface of the substrate, and the second surface of the first retainer wall is curved such that the first retainer wall is wider at a base adjacent to the substrate than at an end farthest from the substrate.

33. The semiconductor packaging device according to claim 10, wherein a material that makes up the first filling has a higher viscosity than a material that makes up the first retainer wall.

34. The semiconductor packaging device according to claim 10, wherein the first retainer wall comprises an insulation material.

35. The semiconductor packaging device according to claim 10, wherein the first filling comprises an insulation material.

36. The semiconductor packaging device according to claim 10, wherein the first filling comprises a material to conduct heat.

37. A semiconductor packaging device, comprising:

a substrate;

a first semiconductor package and a second semiconductor package located on the substrate, the first semiconductor package and the second semiconductor package being spaced apart from each other;

a side retainer wall on the substrate, the side retainer wall having a first side part being in contact with first sides of the first semiconductor package and the second semiconductor package and a second side part being in contact with second sides of the first semiconductor package and the second semiconductor package, wherein the first sides are opposite the second sides, and the first side part and the second side part of the side retainer wall define an area between the first semiconductor package and the second semiconductor package; and a filling layer to fill the area.

38. The semiconductor packaging device of claim 37, wherein the first side part and the second side part of the side retainer wall are directly in contact with the first and second sides of the first and second semiconductor package.

39. The semiconductor packaging device of claim 37, wherein the first semiconductor package and second semiconductor package include a plurality of semiconductor packages stacked one on top of the other, respectively.

* * * * *

UNITED STATES PATENT AND TRADEMARK OFFICE
CERTIFICATE OF CORRECTION

PATENT NO. : 8,148,828 B2
APPLICATION NO. : 12/604680
DATED : April 3, 2012
INVENTOR(S) : Dong-Woo Shin et al.

It is certified that error appears in the above-identified patent and that said Letters Patent is hereby corrected as shown below:

Title Page: Insert

Section --(30) Foreign Application Data
October 23, 2008 (KR)......10-2008-0104428--

Signed and Sealed this
Nineteenth Day of June, 2012

David J. Kappos
*Director of the United States Patent and Trademark Office*